US007186601B2

(12) United States Patent
Fukunaga et al.

(10) Patent No.: US 7,186,601 B2
(45) Date of Patent: *Mar. 6, 2007

(54) METHOD OF FABRICATING A SEMICONDUCTOR DEVICE UTILIZING A CATALYST MATERIAL SOLUTION

(75) Inventors: Takeshi Fukunaga, Kanagawa (JP);
Hisashi Ohtani, Kanagawa (JP);
Akiharu Miyanaga, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/752,994

(22) Filed: Jan. 8, 2004

(65) Prior Publication Data

US 2004/0142543 A1 Jul. 22, 2004

Related U.S. Application Data

(63) Continuation of application No. 08/781,920, filed on Dec. 30, 1996, now abandoned, which is a continuation of application No. 08/519,420, filed on Aug. 25, 1995, now abandoned.

(30) Foreign Application Priority Data

Aug. 26, 1994 (JP) .................................. 6-225851

(51) Int. Cl.
*H01L 21/3213* (2006.01)
*H01L 21/428* (2006.01)
*H01L 21/477* (2006.01)
*B05D 3/06* (2006.01)

(52) U.S. Cl. ...................... 438/166; 427/554; 427/557; 427/559; 427/556; 438/164; 438/487

(58) Field of Classification Search ................ 427/553, 427/554, 555, 559; 438/166, 486, 487, 488
See application file for complete search history.

(56) References Cited

U.S. PATENT DOCUMENTS 4,249,962 A 2/1981 Celler (Continued)

FOREIGN PATENT DOCUMENTS

EP 0 390 608 A2 10/1990

(Continued)

OTHER PUBLICATIONS

A.V. Dvurechenskii et al., "Transport phenomena in Amorphous Silicon Doped by Ion Implantation of 3d Metals," *Phys. Stat. Sol.* (a), 95, 1986, pp. 635-640, no month.

(Continued)

*Primary Examiner*—Marianne Padgett
(74) *Attorney, Agent, or Firm*—Nixon Peabody LLP; Jeffrey L. Costellia

(57) ABSTRACT

A very thin oxide film is formed on an amorphous silicon film that is formed on a glass substrate, and an aqueous solution such as an acetate solution added with a catalyst element such as nickel by 10 to 200 ppm (adjustment needed) is dropped thereon. After the structure is held in this state for a predetermined period, spin drying is performed by using a spinner. A crystalline silicon film is obtained by subjecting the structure to a heat treatment of 550° C. and 4 hours and then to laser light irradiation. A crystalline silicon film having a smaller defect concentration is obtained by further performing a heat treatment of 550° C. and 4 hours.

32 Claims, 10 Drawing Sheets

U.S. PATENT DOCUMENTS

| | | |
|---|---|---|
| 4,292,091 A | 9/1981 | Togei |
| 4,309,225 A | 1/1982 | Fan et al. |
| 4,322,253 A | 3/1982 | Pankove et al. |
| 4,415,373 A | 11/1983 | Pressley |
| 4,539,431 A | 9/1985 | Moddel et al. |
| 4,659,392 A | 4/1987 | Vasudev |
| 4,814,292 A | 3/1989 | Sasaki et al. |
| 5,147,826 A | 9/1992 | Liu et al. |
| 5,275,851 A | 1/1994 | Fonash et al. |
| 5,278,093 A | 1/1994 | Yonehara |
| 5,352,291 A | 10/1994 | Zhang et al. |
| 5,372,836 A | 12/1994 | Imahashi et al. |
| 5,403,762 A | 4/1995 | Takemura |
| 5,403,772 A | 4/1995 | Zhang et al. |
| 5,424,230 A | 6/1995 | Wakai |
| 5,426,064 A | 6/1995 | Zhang et al. |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,529,951 A | 6/1996 | Noguchi et al. |
| 5,531,182 A | 7/1996 | Yonehara |
| 5,534,716 A | 7/1996 | Takemura |
| 5,543,352 A | 8/1996 | Ohtani et al. |
| 5,550,070 A | 8/1996 | Funai et al. |
| 5,563,426 A | 10/1996 | Zhang et al. |
| 5,569,610 A | 10/1996 | Zhang et al. |
| 5,569,936 A | 10/1996 | Zhang et al. |
| 5,572,046 A | 11/1996 | Takemura |
| 5,576,222 A | 11/1996 | Arai et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,597,741 A | 1/1997 | Sakamoto et al. |
| 5,604,360 A | 2/1997 | Zhang et al. |
| 5,605,846 A | 2/1997 | Ohtani et al. |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,619,044 A | 4/1997 | Makita et al. |
| 5,620,910 A | 4/1997 | Teramoto |
| 5,621,224 A | 4/1997 | Yamazaki et al. |
| 5,624,851 A | 4/1997 | Takayama et al. |
| 5,637,187 A | 6/1997 | Takasu et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,003 A | 12/1997 | Makita et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,744,822 A | 4/1998 | Takayama et al. |
| 5,744,824 A | 4/1998 | Kousai et al. |
| 5,756,364 A | 5/1998 | Tanaka et al. |
| 5,766,977 A | 6/1998 | Yamazaki |
| 5,773,327 A | 6/1998 | Yamazaki et al. |
| 5,773,846 A | 6/1998 | Zhang et al. |
| 5,773,847 A | 6/1998 | Hayakawa | |
| 5,795,795 A | 8/1998 | Kousai et al. | |
| 5,808,321 A | 9/1998 | Mitanaga et al. | |
| 5,811,327 A | 9/1998 | Funai et al. | |
| 5,818,076 A | 10/1998 | Zhang et al. | |
| 5,821,138 A | 10/1998 | Yamazaki et al. | |
| 5,821,562 A | 10/1998 | Makita et al. | |
| 5,824,574 A | 10/1998 | Yamazaki et al. | |
| 5,837,569 A | 11/1998 | Makita et al. | |
| 5,854,096 A | 12/1998 | Ohtani et al. | |
| 6,067,062 A | 5/2000 | Takasu et al. | |
| 6,184,068 B1 | 2/2001 | Ohtani et al. | |
| 6,326,248 B1 | 12/2001 | Ohtani et al. | |
| 6,589,824 B2 | 7/2003 | Ohtani et al. | |
| 6,759,313 B2* | 7/2004 | Yamazaki et al. | 438/487 |
| 6,770,518 B2* | 8/2004 | Yamazaki et al. | 438/166 |
| 6,777,273 B1* | 8/2004 | Koyama et al. | 438/166 |
| 6,787,434 B1* | 9/2004 | Lee et al. | 438/487 |
| 6,803,296 B2* | 10/2004 | Miyairi | 438/486 |
| 6,830,994 B2* | 12/2004 | Mitsuki et al. | 438/486 |
| 6,855,580 B2* | 2/2005 | Tanaka et al. | 438/154 |
| 6,884,698 B1* | 4/2005 | Ohtani et al. | 438/486 |
| 6,890,840 B2* | 5/2005 | Isobe et al. | 438/487 |
| 6,908,797 B2* | 6/2005 | Takano | 438/149 |
| 6,908,798 B1* | 6/2005 | Bhattacharyya | 438/166 |
| 6,913,956 B2* | 7/2005 | Hamada et al. | 438/149 |
| 6,924,213 B2* | 8/2005 | Zhang et al. | 438/487 |
| 6,927,107 B1* | 8/2005 | Makita et al. | 438/162 |
| 6,939,754 B2* | 9/2005 | Moriguchi et al. | 438/162 |
| 6,939,755 B1* | 9/2005 | Ohtani et al. | 438/166 |
| 6,955,954 B2* | 10/2005 | Miyanaga et al. | 438/164 |
| 6,974,731 B2* | 12/2005 | Yamazaki et al. | 438/166 |
| 6,974,732 B2* | 12/2005 | Ohtani et al. | 438/166 |
| 6,974,763 B1* | 12/2005 | Zhang et al. | 438/486 |
| 6,979,605 B2* | 12/2005 | Yamazaki et al. | 438/166 |
| 6,979,632 B1* | 12/2005 | Ohtani et al. | 438/487 |
| 6,987,036 B2* | 1/2006 | Hamatani et al. | 438/166 |
| 6,991,976 B2* | 1/2006 | Yamazaki et al. | 438/166 |
| 7,001,829 B1* | 2/2006 | Yamazaki | 438/479 |
| 7,011,995 B2* | 3/2006 | Ohtani et al. | 438/150 |
| 7,015,057 B2* | 3/2006 | Koyama et al. | 438/30 |
| 7,015,079 B2* | 3/2006 | Miyairi et al. | 438/149 |
| 7,015,083 B2* | 3/2006 | Yamazaki et al. | 438/166 |
| 7,022,589 B2* | 4/2006 | Yamazaki | 438/473 |
| 7,026,193 B1* | 4/2006 | Ohtani et al. | 438/149 |
| 7,033,871 B2* | 4/2006 | Nakamura et al. | 438/162 |
| 7,037,779 B2* | 5/2006 | Nakajima | 438/257 |
| 7,037,811 B1* | 5/2006 | Yamazaki et al. | 438/487 |
| 7,045,444 B2* | 5/2006 | Yamazaki et al. | 438/471 |
| 7,052,943 B2* | 5/2006 | Yamazaki et al. | 438/166 |
| 7,056,381 B1* | 6/2006 | Yamazaki et al. | 117/85 |
| 7,060,544 B2* | 6/2006 | Kim et al. | 438/162 |
| 7,087,504 B2* | 8/2006 | Nakajima et al. | 438/486 |
| 7,098,084 B2* | 8/2006 | Tanaka et al. | 438/149 |
| 7,098,088 B2* | 8/2006 | Yamazaki et al. | 438/151 |
| 7,109,073 B2* | 9/2006 | Yamazaki | 438/150 |
| 7,109,074 B2* | 9/2006 | Ichijo et al. | 438/162 |
| 2004/0157413 A1* | 8/2004 | Miyairi et al. | 438/479 |
| 2004/0232491 A1* | 11/2004 | Miyanaga et al. | 257/347 |
| 2004/0241921 A1* | 12/2004 | Yeh et al. | 438/166 |
| 2004/0266147 A1* | 12/2004 | Shimomura et al. | 438/488 |
| 2005/0037551 A1* | 2/2005 | Moriguchi et al. | 438/166 |
| 2005/0048744 A1* | 3/2005 | Isobe et al. | 438/486 |
| 2005/0224799 A1* | 10/2005 | Yamamoto et al. | 257/66 |
| 2005/0277233 A1* | 12/2005 | Ohtani et al. | 438/166 |
| 2006/0014337 A1* | 1/2006 | Takemura | 438/166 |
| 2006/0017052 A1* | 1/2006 | Kakkad | 257/66 |
| 2006/0024925 A1* | 2/2006 | Nakazawa et al. | 438/486 |
| 2006/0051907 A1* | 3/2006 | Yamazaki et al | 438/149 |
| 2006/0057786 A1* | 3/2006 | Yamazaki | 438/149 |
| 2006/0099780 A1* | 5/2006 | Yamazaki et al | 438/487 |
| 2006/0134840 A1* | 6/2006 | Ohtani et al. | 438/150 |
| 2006/0148218 A1* | 7/2006 | Yamazaki et al. | 438/486 |

| | | |
|---|---|---|
| 2006/0183276 A1* | 8/2006 | Yamazaki et al. .......... 438/166 |

FOREIGN PATENT DOCUMENTS

| | | |
|---|---|---|
| EP | 0 474 474 A2 | 3/1992 |
| EP | 0 612 102 | 8/1994 |
| JP | 02-027320 | 1/1990 |
| JP | 2-140915 | 5/1990 |
| JP | 02-208635 | 8/1990 |
| JP | 2-260524 | 10/1990 |
| JP | 03-227525 | 10/1991 |
| JP | 03-280420 | 12/1991 |
| JP | 04-340724 | 11/1992 |
| JP | 04-362924 | 12/1992 |
| JP | 05-063001 | 3/1993 |
| JP | 05-067635 | 3/1993 |
| JP | 05-218368 | 8/1993 |
| JP | 06-077252 | 3/1994 |
| JP | 06-097073 | 4/1994 |
| JP | 06-125084 | 5/1994 |
| JP | 06-181222 | 6/1994 |
| JP | 07-283135 | 10/1995 |
| JP | 08-008181 | 1/1996 |

OTHER PUBLICATIONS

R. Kakkad et al., "Crystallized Si films by Low-temperature rapid thermal annealing of amorphous silicon," *J.Appl. Phys.*, 65(5), Mar. 1, 1989, pp. 2069-2072.

Caune et al., "Combined CW Laser and Furnace Annealing of Amorphous Si and Ge in Contact with Some Metals," *Applied Surface Science*, vol. 36, 1989, pp. 597-604, no month.

G. Liu et al., "Selective area crystallization of amorphous silicon films by low-temperature rapid thermal annealing," *Appl. Phys. Lett.* 55(7), Aug. 14, 1989, pp. 660-662.

R. Kakkad et al., "Low Temperature Selective Crystallization of Amorphous Silicon," *Journal of Non-Crystalline Solids*, 115, Aug. 24-25, 1989, pp. 66-68.

Kawazu et al., "Low-Temperature Crystallization of Hydrogenated Amorphous Silicon Induced by Nickel Silicide Formation," *Japanese Journal of Applied Physics*, vol. 29, No. 12, Dec. 1990, pp. 2698-2704.

C. Hayzelden et al., "*In Situ* Transmission Electron Microscopy Studies of Silicide-Mediated Crystallization of Amorphous Silicon," *Appl. Phys. Lett.* 60(2), Jan. 13, 1992, pp. 225-227.

T. Hempel et al., "Needle-Like Crystallization of Ni Doped Amorphous Silicon Thin Films," *Solid State Communications*, vol. 85, No. 11, Mar. 1993, pp. 921-924.

G. Liu et al., "Polycrystalline silicon thin film transistors on Corning 7059 glass substrates using short time, low-temperature processing," *Appl. Phys. Lett.* 62(20), May 17, 1993, 2554-2556.

Nam et al., "Thin Film Transistors with Polycrystalline Silicon Prepared by a new Annealing Method," *Jpn. J. Appl. Phys.*, vol. 32, 1993, pp. 1908-1912, no month.

Bonnel et al., "Poly Crystalline Silicon Thin-Film Transistors with Two-Step Annealing Process," *IEEE, Electron Device Letters*, vol. 14, No. 12, Dec. 1993, pp. 551-553.

Fuse et al., "Performance of Poly-Si Thin Film Transistors Fabricated by Excimer Laser Annealing of $SiH_4$ and $Si_2H_6$ Source Low Pressure Vapor Deposited a-Si films with or without Solid-Phase Crystallization," *Solid State Phenomena*, vols. 37-38, 1994, no month.

\* cited by examiner

| No | Sample Preparation Conditions | Spin Density (spins/cm$^3$) | g-value |
|---|---|---|---|
| 1 | 560°C, 4h | $3.22 \times 10^{18}$ | 2.0055 |
| 2 | 550°C, 4h | $7.72 \times 10^{18}$ | 2.0055 |
| 3 | (550°C, 4h) + LC | $8.21 \times 10^{18}$ | 2.0057 |
| 4 | (550°C, 4h) + LC + (550°C, 4h) | $7.65 \times 10^{17}$ | 2.0051 |
| 5 | 600°C, 24h | $1.06 \times 10^{18}$ | 2.0052 |
| 6 | 600°C, 24h (Non-Ni) | $3.06 \times 10^{18}$ | 2.0049 |

Fig. 8

METHOD OF FABRICATING A SEMICONDUCTOR DEVICE UTILIZING A CATALYST MATERIAL SOLUTION

This application is a continuation of prior application Ser. No. 08/781,920, filed Dec. 30, 1996, now abandoned, which is a continuation of application Ser. No. 08/519,420, filed Aug. 25, 1995, now abandoned.

FIELD OF THE INVENTION

The present invention relates to a semiconductor device using a crystalline semiconductor and a manufacturing method for the same.

BACKGROUND OF THE INVENTION

There are known thin film transistors (TFTs), which use a thin film semiconductor that is formed on a substrate. While TFTs are used for various integrated circuits, they attract much attention particularly as switching elements provided for each pixel of an electro-optical device, particularly an active matrix type liquid crystal display device and as driver elements formed in its peripheral circuit portion.

Although an amorphous silicon film is conveniently used for the TFTs, it has a problem of low-grade electrical characteristics. The characteristics of the TFT can be improved by using a crystalline silicon thin film. "Crystalline silicon" includes polycrystalline silicon, polysilicon, microcrystalline silicon, or the like. A crystalline silicon can be obtained by forming an amorphous silicon film and then crystallizing it by heating.

However, since the crystallization by heating takes more than 20 hours at a heating temperature higher than 600° C., it is difficult to use a glass substrate. For example, Corning 7059 glass, which is used for active liquid crystal display devices, has a glass strain point of 593° C. Therefore, as the size of a substrate becomes larger, heating at more than 600° C. will be problematic. That is, if a commonly used Corning 7059 glass substrate is subjected to a heat treatment at 600° C. or higher and for 20 hours or longer, it will exhibit remarkable contraction and bending.

To solve the above problem, it is necessary to perform a heat treatment at a temperature as low as possible. On the other hand, to increase the productivity, it is required that the time for the heat treatment step should be as short as possible.

Further, when an amorphous silicon film is crystallized by heating, the entire silicon film is crystallized; that is, it is impossible to effect partial crystallization nor control the crystallinity of a particular region.

To solve this problem, Japanese Unexamined Patent Publication Nos. 2-140915 and 2-260524 disclose techniques of effecting selective crystallization by artificially forming a portion or region where crystalline nuclei are to be generated in an amorphous silicon film and then subjecting the film to a heat treatment. These techniques are intended to form crystalline nuclei at a prescribed portion in an amorphous silicon film.

For example, the publication No. 2-140915 discloses a technique in which an aluminum layer is formed on an amorphous silicon film, crystalline nuclei are generated in the portion where amorphous silicon and aluminum are contacted with each other, and crystal growth is caused to proceed from the crystalline nuclei by a heat treatment. The 2-260524 publication discloses a technique in which tin (Sn) is added to an amorphous silicon film by ion implantation and crystalline nuclei are generated in a tin-ion-added region.

However, since Al and Sn are substitutional metal elements, they form an alloy with silicon and do not diffuse into a silicon film. Crystallization proceeds such that crystalline nuclei are generated in a portion where an alloy with silicon is formed and crystal growth is started from that portion. That is, the cases of using Al or Sn is characterized in that crystal growth starts from a portion where Al or Sn is introduced, i.e., from an alloy layer of that element and silicon. In general, crystallization is a two-step process consisting of generation of initial nuclei and crystal growth from that nuclei. Although Al and Sn, which are substitutional metal element with respect to silicon, are effective in generating initial nuclei, they are not effective in crystal growth that should follow.

Therefore, even if Al or Sn is used, the crystallization temperature cannot be lowered nor can the crystallization time be shortened from the case of crystallizing an amorphous silicon film simply by heating it. That is, the use of Al or Si has no advantage over the conventional process of crystallizing an amorphous silicon film simply by heating it.

In accordance with the investigation by the inventors of the present invention, crystallization can be performed for about 4 hours at 550° C. by employing a process in which a very small amount of an interstitial element with respect to silicon, such as nickel or palladium, is deposited on the surface of an amorphous silicon film and then heating is effected. This process facilitates not only the initial nucleus generating step but also the subsequent crystal growth, and can therefore greatly lower the heating temperature and shorten the heating time compared with the conventional case of using only heating.

A small amount of the above mentioned element (catalyst element for accelerating crystallization) may be introduced by plasma treatment, evaporation or ion implantation. The plasma treatment is a method in which in a parallel-plate type or positive-column-type plasma CVD apparatus, a catalyst element is added to an amorphous silicon film by using, as an electrode, a material containing the catalyst element and generating a plasma in an atmosphere of nitrogen, hydrogen, or the like.

Examples of the above metal element for accelerating crystallization are interstitial elements of Fe, Co, Ni, Ru, Rh, Pd, Os, Ir, Pt, Cu, Ag and Au. These interstitial elements are diffused into a silicon film in a heat treatment process. Then, crystallization of silicon proceeds as the interstitial element diffuses. That is, the interstitial metal accelerates crystallization of an amorphous silicon film by its catalytic effect at every point which it reaches.

Therefore, the interstitial elements can cause crystallization to proceed in the manner different than in the case where crystallization gradually proceeds from crystalline nuclei. For example, where one of the above metal elements is introduced into an amorphous silicon film at a particular point and then a heat treatment is performed, crystallization proceeds parallel with the film surface from the portion where the metal element was introduced over more than several tens of micrometers. Where a metal element is introduced into an amorphous silicon film over its entire area, the entire film can be crystallized uniformly. In this case, although the entire film may result in a polycrystalline or microcrystalline structure, no clear grain boundary exists at a particular location. Therefore, it is possible to form devices having uniform characteristics in an arbitrary portion of the film.

Since the interstitial elements diffuse into a silicon film quickly, it is important to properly determine their introduction quantity (addition quantity). If the introduction quantity is too small, good crystallinity is not obtained because of an insufficient effect of accelerating crystallization. Conversely, if the introduction quantity is too large, semiconductor characteristics of silicon are degraded.

Thus, there exists an optimum introduction quantity with respect to an amorphous silicon film for each of the above-mentioned, metal elements. For example, where Ni is selected as a metal element for accelerating crystallization, the effect of accelerating crystallization is obtained if its concentration in a crystallized silicon film is more than $1 \times 10^{15}$ cm$^{-3}$, and that the semiconductor characteristics are not degraded if the concentration is less than $5 \times 10^{19}$ cm$^{-3}$. The concentration as mentioned above is defined as the minimum of values obtained by SIMS (secondary ion mass spectrometry). The above-mentioned metal elements other than Ni also exhibit their effect properly in respective concentration ranges similar to that of Ni.

So that the concentration of an element, such as Ni, for accelerating crystallization in a crystallized silicon film should fall within an optimum range, its quantity needs to be controlled when it is introduced into an amorphous silicon film.

Also, as to the case of using nickel as a catalyst element, the following facts have been found by a study in which amorphous silicon films were deposited, crystalline silicon films were then formed by adding Ni by a plasma treatment with detailed investigation of the crystallization process.

(1) When nickel is introduced into an amorphous silicon film by plasma processing, nickel has already been intruded into a considerable depth of the amorphous silicon film before a heat treatment is performed.

(2) Initial crystalline nuclei are generated at the surface through which nickel was introduced.

(3) Crystallization occurs even with a nickel coating deposited on an amorphous silicon film by evaporation in the same manner as in the case of using plasma processing.

It is concluded from the above facts that not all of nickel introduced by plasma processing functions effectively. That is, even if a large amount of nickel is introduced, part of it does not functions sufficiently. This leads to a conclusion that points (or a surface) where nickel and silicon are contacted with each other function in low-temperature crystallization. Therefore, it is necessary that nickel be dispersed in the form of as small particles as possible, preferably in the form of atoms. That is, it is concluded that nickel should be so introduced as to be dispersed in the form of atoms at as low a concentration as possible that allows low-temperature crystallization in a portion close to the surface of an amorphous silicon film.

Evaporation is a candidate of introducing a very small amount of nickel into only a portion close to the surface of an amorphous silicon film, in other words, introducing a very small amount of catalyst element so that crystallization is accelerated only in a portion close to the surface of an amorphous silicon film. However, evaporation has a problem of low controllability; that is, it is difficult to strictly control the introduction quantity of a catalyst element.

Further, the introduction quantity of a catalyst element needs to be as small as possible, which causes a problem that it is difficult to obtain a sufficient crystallization.

SUMMARY OF THE INVENTION

An object of the present invention is to attain at least one of the following in manufacture of a crystalline thin-film silicon semiconductor using a catalyst element:

(1) Minimizing the quantity of a catalyst element by introducing it with control.

(2) Improving the productivity.

(3) Obtaining crystallinity better than that obtained with a heat treatment.

To attain the above object, the invention provides a crystalline silicon film in the following manner.

Crystallinity is imparted to an amorphous silicon film by irradiating it with laser light or strong light in a state that a catalyst element for accelerating crystallization of the amorphous silicon film or a compound including the catalyst element is held in contact with the amorphous silicon film. Thus, there can be obtained a crystalline silicon film having extremely superior crystallinity.

A promising method of introducing a catalyst element for accelerating crystallization is to apply a solution containing the catalyst element to the surface of an amorphous silicon film.

In particular, the present invention is characterized in that a catalyst element is introduced so as to be in contact with the surface of an amorphous silicon film. This is very important in controlling the quantity of the catalyst element.

A catalyst element may be introduced into either a top or a bottom surface of an amorphous silicon film. To introduce a catalyst element into the top surface of an amorphous silicon film, a solution containing the catalyst element may be applied to the amorphous silicon film after it is formed. To introduce the catalyst element into the bottom surface of an amorphous silicon film, a solution containing the catalyst element may be applied to an undercoat surface to allow the catalyst element to be held in contact with the undercoat surface.

The present invention is also characterized by forming an active region having at least one of PN, PI, NI, and other electrical junctions of a semiconductor device by using a crystallized silicon film. Examples of the semiconductor device are a thin-film transistor (TFT), a diode and a photosensor. A resistor and a capacitor can also be formed by using the present invention.

The following basic advantages can be obtained by using the present invention:

(a) It is possible to precisely control the density of a catalyst element in a solution, to thereby improve the crystallinity and control the quantity of the catalyst element introduced into the silicon film.

(b) If a solution is substantially contacted with the surface of an amorphous silicon film, the introduction quantity of the catalyst element into the amorphous silicon film is determined by the density of the catalyst element in the solution.

(c) Since a catalyst element absorbed on the surface of an amorphous silicon film mainly contributes to the crystallization, the catalyst element can be introduced with its density set at a minimum necessary value.

(d) A crystalline silicon film having superior crystallinity can be obtained without a high-temperature process.

An aqueous solution, a solution with an organic solvent, or the like may be used as a solution containing an element for accelerating crystallization which is to be applied to an amorphous silicon film. The term "containing" means both of a case where a catalyst element is included as a compound, and a case where it is dispersed in a solution.

Examples of the solvent for dissolving a catalyst element are water, alcohol, acid, and ammonia water, which are polar solvents.

Nickel is used as a catalyst. To dissolve nickel in a polar solvent, it should take a form of a nickel compound. Typical nickel compounds are nickel bromide, nickel acetate, nickel oxalate, nickel carbonate, nickel chloride, nickel iodide, nickel nitrate, nickel sulfate, nickel formate, nickel acetylacetonate, nickel 4-cyclohexylbutyrate, nickel oxide, and nickel hydroxide.

Other examples of the solvent for dissolving a catalyst element are benzene, toluene, xylene, carbon tetrachloride, chloroform, and ether, which are non-polar solvents.

Also in this case, nickel should take a form of a nickel compound. Typical nickel compounds are nickel acetylacetonate and nickel 2-ethylhexanoate.

It is effective to add a surfactant to a solution containing a catalyst element. This is intended to control absorption performance by improving adhesiveness to the surface to be coated. A surfactant may be applied in advance to the surface to be coated.

Where a nickel element is used as a catalyst element, it needs to be dissolved in acid to form a solution.

Although the above examples are directed to the case of using a solution in which nickel as a catalyst element is completely dissolved, the present invention is not limited to such a case. That is, an emulsion-like material may be used in which a powder of a nickel element or nickel compound is uniformly dispersed in a dispersion medium. Alternatively, a solution for forming an oxide film may be used, such as OCD (Ohka diffusion source) marketed by Tokyo Ohka Kogyo Co., Ltd. A silicon oxide film can be easily formed by applying an OCD solution to a surface to be coated and baking it at about 200° C. The OCD solution can be used for the present invention, because impurities can be added to it freely. In this case, the following process may be performed. An oxide film is made to contain a catalyst element, and then is disposed in contact with an amorphous film. Heating is then performed at 350 to 400° C. to diffuse the catalyst element into the amorphous silicon film. After the oxide film is removed, a heat treatment for crystallization may be performed at 450 to 600° C., for instance, 550° C., for 4 hours.

The above also applies to cases where materials other than nickel are used as a catalyst element.

Where nickel is used as a catalyst element for accelerating crystallization and a polar solvent such as water is used as a solvent for dissolving nickel, the solution is repelled by an amorphous silicon film if the solution is directly applied to the amorphous silicon film. In such a case, it becomes possible to apply a solution uniformly by first forming a thin oxide film of 100 Å or less in thickness and then applying a solution containing a catalyst element to it. It is effective to improve wettability by adding such a material as a surfactant.

A solution can directly be applied to the surface of an amorphous silicon film by using a non-polar solvent such as a toluene solution of nickel 2-ethylhexanoate. In this case, it is effective to apply in advance such a material as an adhesiveness enhancing agent that is used in a resist application. However, care should be taken to avoid an event that excessive application of the adhesiveness enhancing agent obstructs addition of a catalyst element to an amorphous silicon film.

The quantity of a catalyst element to be contained in a solution depends on the kind of solution. However, it is generally desired that the nickel quantity be 1 to 200 ppm, preferably 1 to 50 ppm (in terms of weight) with respect to a solution. The nickel quantity should be determined in view of a nickel concentration in a crystallization-completed film and resistance to hydrofluoric acid.

Defects in a film can be reduced by performing a heat treatment after a crystalline silicon film is obtained by the laser light irradiation. It is preferred that this heat treatment be performed at 450 to 750° C. In the case of using a glass substrate, the temperature range should be 450 to 600° C.

It is also effective to perform a heat treatment before the laser light irradiation. In this heat treatment, a sample is heated to 450 to 750° C., preferably 450 to 600° C.

A pulsed oscillation type excimer laser can be used to obtain laser light. Examples are a KrF excimer laser (wavelength: 248 nm), XeCl excimer laser (308 nm), XeF excimer laser (351 and 353 nm), ArF excimer laser (193 nm), and XeF excimer laser (483 nm). The excitation method may be discharge excitation, X-ray excitation, optical excitation, microwave-discharge excitation, or electron beam excitation.

Instead of laser light, other strong light, particularly infrared light, may be applied. Infrared light is effective in selectively heating a silicon thin film formed on a glass substrate, because it is hardly absorbed by glass while easily absorbed by a silicon thin film. The method of using infrared light is called rapid thermal annealing (RTA) or a rapid thermal process (RTP).

A heat treatment that is performed after the irradiation with laser light or strong light can reduce defects in a crystalline silicon film. FIG. 8 shows results of measurements in which spin densities of crystalline silicon films manufactured under listed conditions (column of "sample manufacturing condition") were measured by the electron spin resonance (ESR) method. Although the results of FIG. 8 were obtained in a case where a heat treatment was conducted before the laser light irradiation, similar results would be obtained even without the preliminary heat treatment.

Heating temperatures and heating periods in a nitrogen atmosphere are shown in the column of "sample manufacturing condition" of FIG. 8, and "LC" means laser light irradiation. The samples other than sample No. 6 that is given parenthesized words "without Ni" were crystallized with nickel used as a catalyst element. The g-value is an index indicating a peak position in a spectrum. A g-value of 2.0055 corresponds to a peak due to dangling bonds. Therefore, it is understood that the spin densities shown in FIG. 8 correspond to dangling bonds in films.

It is seen from FIG. 8 that sample No. 4 has the lowest spin density, which means the number of dangling bonds in the film is smallest; that is, the numbers of defects and energy states in the film are smallest. For example, by comparing sample Nos. 3 and 4, it is understood that the spin density can be reduced by about one order; that is, the numbers of defects and energy states in a crystalline silicon film can be reduced by more than one order by subjecting it to a heat treatment after the laser light irradiation.

A comparison between sample Nos. 2 and 3 of FIG. 8 shows that the laser light irradiation causes almost no change of the spin density; that is, the laser light irradiation has no effect on the reduction of defects in a film. However, analyses etc. of photographs taken by a transmission electron microscope have revealed that in some cases the laser light irradiation is very effective in improving the crystallinity. Thus, it is concluded that the laser light irradiation is very effective in improving the crystallinity of a crystalline silicon film that has already been crystallized by heating, and that subjecting again the crystallinity-improved film to a heat treatment is very effective in reducing defects in the film. In this manner, a silicon film that has superior crystallinity and a low defect concentration can be obtained.

Further, the present invention enables selective crystal growth by selectively applying a solution containing a metal element, i.e., by selectively introducing a metal element for accelerating crystallization. In particular, in this case, crystal growth can be caused to proceed from a region where the solution is applied to a region where it is not applied in the direction approximately parallel with the surface of a silicon film. In this specification, the region where crystal growth has been effected approximately in parallel with the surface of a silicon film is called a "region where crystal growth has proceeded laterally", or simply "a lateral growth region".

It has been confirmed that the concentration of a catalyst element is low in the lateral growth region. While a crystalline silicon film is effectively used as an active layer of a semiconductor device, it is generally preferable that the impurity concentration in the active layer be low. Therefore, it is effective in manufacturing a device to form an active layer by using the lateral growth region.

In the present invention, most remarkable advantages can be obtained when nickel is used as a catalyst element. There may be used one or a plurality of metal elements selected from Fe, Co, Ni, Ru, Rh, Pd, Os, Ir, Pt, Cu, Ag, and Au.

The method of introducing a catalyst element is not limited to the case of using a solution such as an aqueous solution or alcohol, but a wide variety of substances containing a catalyst element may be used. For example, metal compounds and oxides containing a catalyst element may be used.

Further, to improve the crystallization ratio, the step of applying laser light or strong light and the heat treatment step for reducing defects in a film may alternately be repeated two or more times.

According to the present invention, by virtue of the effect of an interstitial element for accelerating crystallization, the crystallization of an amorphous silicon film can be performed at a low temperature in a short time. Specifically, the invention enables manufacture of a crystalline silicon film by a heat treatment of 550° C. and about 4 hours, which was impossible conventionally. An interstitial element with respect to silicon accelerates crystallization as it diffuses through a silicon film. Therefore, a crystalline silicon film can be obtained which does not have definite crystal grain boundaries, in contrast to the case of crystal growth from crystalline nuclei.

Further, a silicon film that is small in the number of defects and has superior crystallinity can be obtained by applying laser light or strong light to a crystalline silicon film that has been crystallized by heating with assistance of the effect of a catalyst element, and then performing an additional heat treatment.

The laser light irradiation cannot reduce defects in a film. Further, the laser light irradiation instantaneously renders the surface of a silicon film in a fused state, to cause stress in the film, and the stress may cause new defects therein. The additional heat treatment can lower the number of defects by reducing the stress, thus enabling provision of a crystalline silicon film having superior electrical characteristics.

BRIEF DESCRIPTION OF THE DRAWINGS

FIG. 8 shows results of ESR measurements;

DESCRIPTION OF THE PREFERRED EMBODIMENTS

Embodiment 1

Figure 1A:
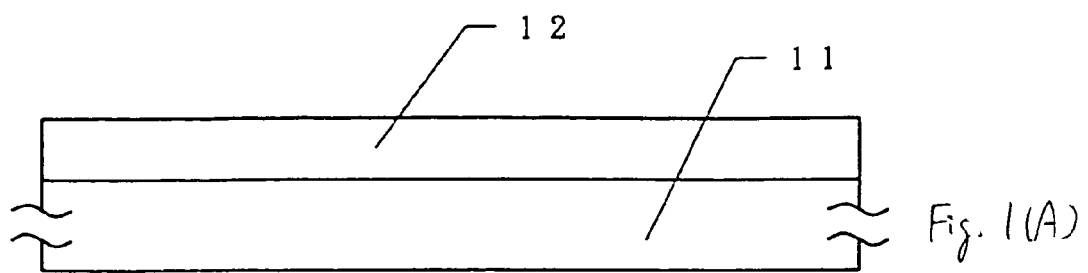
FIGS. 1(A) to 1(D) show a manufacturing process according to a first embodiment of the present invention.
Figure 1B:
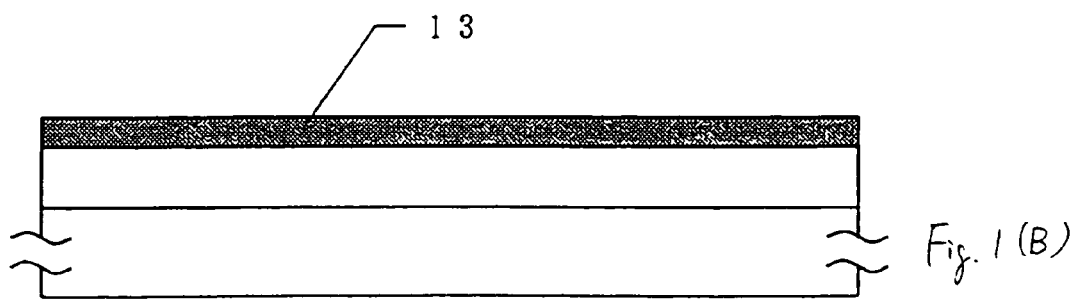
Figure 1C:
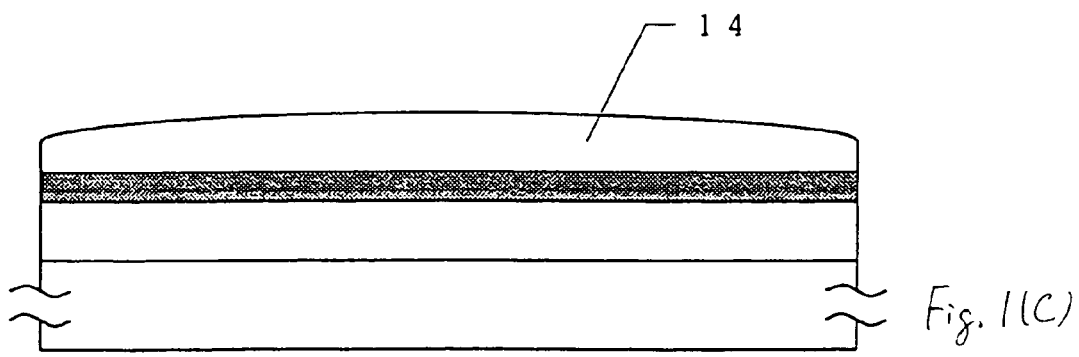
Figure 1D:
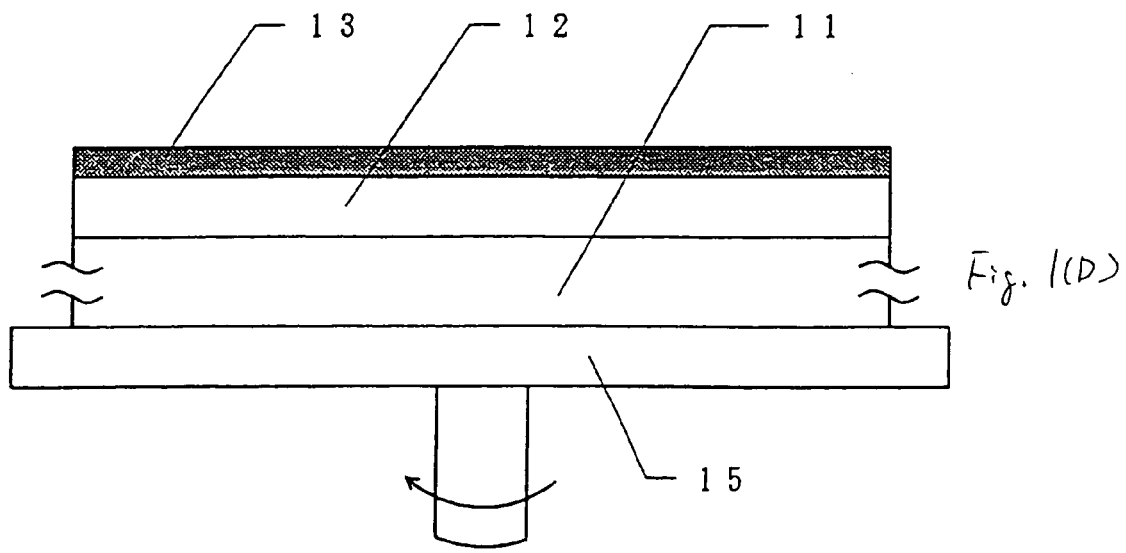

In this embodiment, to impart crystallinity to an amorphous silicon film, an aqueous solution containing a catalyst element for accelerating crystallization is applied to the amorphous silicon film, and then laser light irradiation is performed.

Referring to FIGS. 1(A) to 1(D), steps to the introduction of a catalyst element (nickel in this embodiment) will be described. In this embodiment, a plate of Corning 7059 glass having a size of 100 mm×100 mm is used as a substrate 11.

First, an amorphous silicon film of 100 to 1,500 Å in thickness is deposited by plasma CVD or LPCVD. In this embodiment, a 1,000-Å-thick amorphous silicon film 12 is deposited by plasma CVD. (FIG. 1(A))

Then, a hydrofluoric acid treatment is performed to remove stain and a natural oxide film, and an oxide film 13 of 10 to 50 Å in thickness is formed. Where stain is negligible, the natural oxide film itself may be used instead of the oxide film 13. (FIG. 1(B))

Since the oxide film 13 is very thin, its precise thickness is not known. However, it is estimated to be about 20 Å. In this embodiment, the oxide film 13 is formed by 5-minute irradiation with UV light in an oxygen atmosphere. Alternatively, the oxide film 13 may be formed by thermal oxidation or a treatment with hydrogen peroxide.

The oxide film 13 serves to allow an acetate solution containing nickel 14 to spread over the entire surface of the amorphous silicon film 12 uniformly in a following step of applying the acetate solution, that is, to improve the wettability. For example, where an acetate solution is directly applied to the surface of an amorphous silicon film 12, the amorphous silicon film 12 repels the acetate solution to prevent nickel from being introduced into the amorphous silicon film 12 through its entire surface. Thus, uniform crystallization cannot be attained.

Then, an acetate solution is produced which contains nickel at a density of 25 ppm. A 2-ml droplet of an acetate solution is dropped onto the surface of the oxide film 13 that is formed on the amorphous silicon film 12, and a resulting state is kept for 5 minutes. Spin drying is then performed at 2,000 rpm for 60 seconds by using a spinner. (FIGS. 1(C) and 1(D))

From the viewpoint of practicality, the density of nickel in the acetate solution should be more than 1 ppm, preferably more than 10 ppm. Where a non-polar solvent such as a toluene solution of nickel 2-ethlhexanoate, the oxide film 13 is not necessary; that is, a catalyst element can directly be introduced through the top surface of the amorphous silicon film 12.

By performing the above step of applying the nickel solution one to several times, after the spin drying, a nickel-containing layer having an average thickness of several angstroms to several hundred angstroms can be formed on the surface of the amorphous silicon film 12. In a subsequent heating step, nickel contained in this layer diffuses into the amorphous silicon film 12, and serves as a catalyst for accelerating crystallization. It is noted that this layer is not always a complete film.

The state immediately after the application of the solution is kept for 1 minute. Although the density of nickel finally introduced into the silicon film 12 can be controlled by this period, the largest control factor is the density of the solution.

Crystallinity is imparted to the amorphous silicon film 12 by applying KrF excimer laser light to the sample that is heated to 550° C. in a nitrogen atmosphere. The reason why the sample is heated is to enhance the crystallizing effect of the laser light irradiation. In this embodiment, a KrF excimer laser (wavelength: 248 nm; pulse width: 30 nsec) is caused to emit several shots at a power density of 200 to 350 mJ/cm$^2$. In this step, it is effective to increase the pulse width of the excimer laser light. This is so because the period during which the surface portion of the silicon film 12 is fused by the laser light irradiation is elongated, to thereby accelerate crystal growth in minute portions.

The above heating treatment may be performed at more than 450° C. However, if the temperature is too low, the heating time needs to be elongated, resulting in low production efficiency. On the other hand, if the temperature is set at more than 550° C., the heat resistance problem of a glass substrate surfaces depending upon the kinds of the glass substrate.

Although this embodiment is directed to the case of introducing a catalyst element through the top surface of the amorphous silicon film, there may be employed a method of introducing a catalyst element through the bottom surface of the amorphous silicon film. In the latter case, a catalyst element may be provided on the undercoat film using a solution containing the catalyst element before the deposition of the amorphous silicon film.

After the completion of the laser light irradiation, a heat treatment of 550° C. and 4 hours is performed in a nitrogen atmosphere. This heat treatment may be performed in a temperature range of 450 to 600° C. The heat treatment after the laser light irradiation can reduce defects in the silicon film. Thus, there can be obtained the crystalline silicon film not only superior in crystallinity but also small in the number of defects.

Embodiment 2

A manufacturing method of this embodiment is different from Embodiment 1 in that a 1,200-Å-thick silicon oxide film is selectively formed and nickel is selectively introduced by using the silicon oxide film as a mask. Crystal growth is effected parallel with the substrate.

Figure 2A:
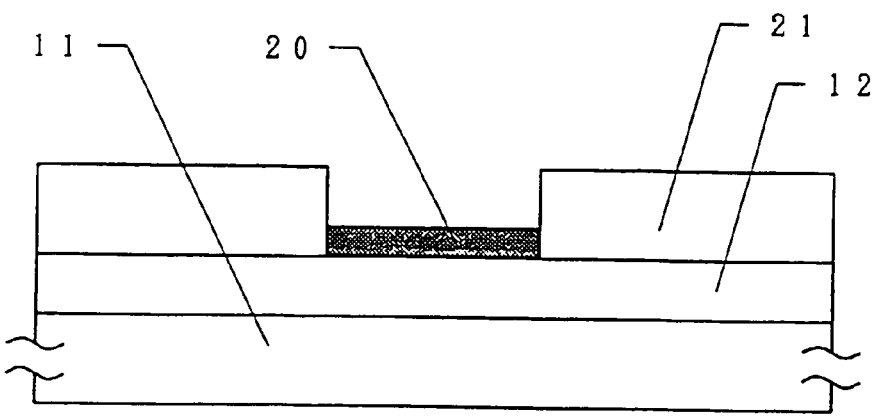
FIGS. 2(A) to 2(C) show a manufacturing process according to a second embodiment of the invention.
Figure 2B:
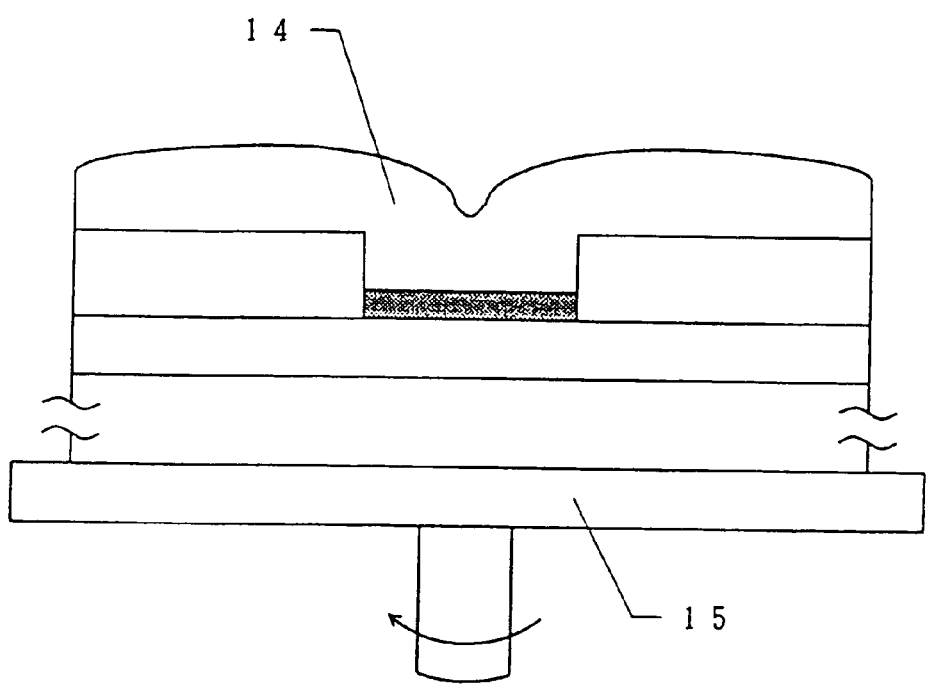
Figure 2C:
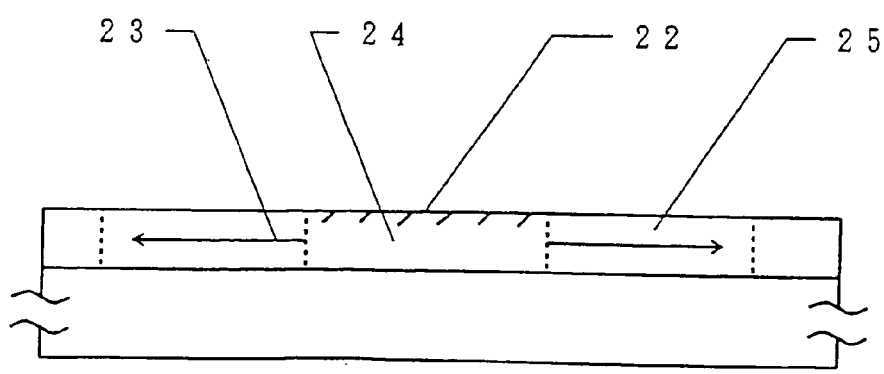

FIGS. 2(A) to 2(C) schematically shows a manufacturing process according to this embodiment. First, a silicon oxide film 21 having a thickness of more than 1,000 Å, of 1,200 Å in this embodiment, that is to become a mask is formed over a glass substrate 11 (Corning 7059, 10 cm×10 cm). Experiments by the inventors have proved that there occurs no problem even if the silicon oxide film 21 is thinner than 500 Å. It appears that the silicon oxide film 21 can further be thinned if it is dense.

The silicon oxide film 21 is then shaped into a desired pattern by ordinary photolithography patterning. And a thin silicon oxide film 20 is formed by 5-minute irradiation with ultraviolet light in an oxygen atmosphere (see FIG. 2(A)). The thickness of the silicon oxide film 20 is estimated to be 20 to 50 Å. As for the silicon oxide film 20 for improving wettability, there is a possibility that a solution is suitably applied by only the hydrophilic property of the silicon oxide film 21 as a mask, which however is a special case. In general, it is more reliable to use the silicon oxide film 20.

In this state, as in the case of Embodiment 1, a 5-ml droplet (for the substrate of 10 cm×10 cm) of an acetate solution containing nickel 14 at 100 ppm is dropped. To form a uniform liquid film over the entire substrate surface, spin coating is performed at 50 rpm for 10 seconds by using a spinner. After the resulting state is held for 5 minutes, spin drying is performed at 2,000 rpm for 60 seconds by using the spinner. Alternatively, the substrate may be held on the spinner while being rotated at 0 to 150 rpm. (FIG. 2(B))

Subsequently, the amorphous silicon film 12 is crystallized by performing a heat treatment of 550° C. for 4 hours in a nitrogen atmosphere. In this step, crystal growth proceeds horizontally (indicated by arrows 23) from a region having a portion 22 through which nickel has been introduced to regions where nickel has not been directly introduced. In FIG. 2(C), reference numerals 24 and 25 denote the region that is crystallized with direct introduction of nickel and the regions in which crystallization proceeds horizontally, respectively. It has been confirmed that in the regions 25 the crystallization proceeds approximately along the <111> axis. It has also been confirmed by taking TEM (transmission electron microscope) photographs that in the regions 25 the crystal growth proceeds so as to form columns or branches that are parallel with the substrate.

The crystallinity of the silicon film 12 is further improved by irradiating it with XeCl laser light (wavelength: 308 nm) after the above crystallization step by the heat treatment. By the laser light irradiation in this step, crystallization proceeds between the columns or between the branches that have been developed in parallel with the substrate by the preceding heat treatment. That is, the crystallization ratio of the silicon film 12 can be increased. In this manner, the crystallinity of the regions 25 in which crystal growth has proceeded horizontally can be improved greatly.

It is effective to heat the substrate or the laser light incident surface in the above laser light irradiation step. It is preferred that the heating temperature be 450 to 600° C.

After the laser light irradiation, a heat treatment is performed at 550° C. for 4 hours in a nitrogen atmosphere, to further reduce defects in the film.

In this embodiment, by changing the solution density and the holding time, the nickel concentration in the region where nickel is directly introduced can be controlled within. $1\times10^{16}$ to $1\times10^{19}$ atoms cm$^{-3}$. Similarly, it is possible to control the nickel concentration in the horizontal crystal growth region within a range lower than the above range.

The crystalline silicon film that has been formed by the method of this embodiment has an advantage of high hydrofluoric acid resistance. According to the knowledge of the present inventors, crystalline silicon films that have been formed by introducing nickel by plasma processing and then effecting crystallization have low hydrofluoric acid resistance.

For example, there is a case where a silicon oxide film as a gate insulating film or an interlayer insulating film is formed on a crystalline silicon film, a hole opening step is performed for an electrode formation, and then electrodes are formed. In such a case, a step of removing the silicon oxide film with buffer hydrofluoric acid is usually employed. However, there is a problem that if the crystalline silicon film has low hydrofluoric acid resistance, it is difficult to remove only the silicon oxide film; that is, the crystalline silicon film is undesirably etched.

In contrast, if the crystalline silicon film has a high hydrofluoric acid resistance, the difference between the etching rates of the silicon oxide film and the crystalline silicon film (selection ratio) can be made large and therefore only the silicon oxide film can be removed selectively, providing a very advantageous manufacturing step.

As described above, since the region where crystal growth has proceeded horizontally has a low catalyst element concentration and superior crystallinity, it is very effective to use this region as an active region of a semiconductor device, for instance, as a channel forming region of a thin-film transistor.

Embodiment 3

This embodiment is directed to the case of forming a TFT by using a crystalline silicon film that is formed by the method of the invention. The TFT of this embodiment can be used in a driver circuit and a pixel area of an active matrix type liquid crystal display device. It goes without saying that the TFT can be applied to not only liquid crystal display devices but also generally called thin-film integrated circuits.

FIGS. 3(A) to 3(E) schematically show a manufacturing process according to this embodiment. First, a 2,000-Å-thick undercoat silicon oxide film (not shown) is deposited on a glass substrate 11 to prevent impurity diffusion from the glass substrate 11.

A 500-Å-thick amorphous silicon film is then formed in the same manner as in Embodiment 1. After a hydrofluoric acid treatment for removing a natural oxide film, a thin oxide film of about 20 Å in thickness is formed by irradiation with ultraviolet light in an oxygen atmosphere. Alternatively, the thin oxide film may be formed by a treatment with hydrogen peroxide water or thermal oxidation.

Then, an acetate solution containing nickel at 10 ppm is applied to the sample. After holding the above state for 5 minutes, spin drying is performed by using a spinner. The silicon oxide films are then removed with buffer hydrofluoric acid. Further, in a state that the sample is heated to 500° C., the crystallinity of the silicon film is enhanced by irradiation with KrF excimer laser light of 200 to 300 mJ/cm$^2$. A crystalline silicon film can be obtained by this step.

Subsequently, the crystallized silicon film is patterned into an island-like region 104, which is to constitute an active layer of a TFT. A silicon oxide film 105 having a thickness of 200 to 1,500 Å, e.g. 1,000 Å, is then formed, which is to serve also as a gate insulating film. (FIG. 3(A))

Attention should be paid in forming the silicon oxide film 105. In this embodiment, a material of TEOS is decomposed and deposited by being subjected, together with oxygen, to RF plasma CVD in a state that the substrate temperature is set at 150 to 600° C., preferably 300 to 450° C. The pressure ratio between TEOS and oxygen is selected to be 1:1 to 1:3. The pressure and the RF power are set at 0.05 to 0.5 torr and 100 to 250 W, respectively. Alternatively, a silicon oxide film may be formed by subjecting a material of TEOS and an ozone gas low-pressure CVD or normal-pressure CVD in a state that the substrate temperature is set at 350 to 600° C., preferably 400 to 550° C. After the deposition of the silicon oxide film, it is annealed at 400 to 600° C. for 30 to 60 minutes in an oxygen or ozone atmosphere.

The crystallinity of the silicon film 104 may be enhanced in this state by irradiation with KrF excimer laser light (wavelength: 248 nm; pulse width: 20 nsec) or strong light equivalent thereto. In particular. RTA (rapid thermal annealing) using infrared light is effective in manufacturing an insulated-gate field-effect semiconductor device, not only because it can selectively heat the silicon film, i.e., without heating the glass substrate but also because interface states between the silicon film and the silicon oxide film can be reduced. After the laser light irradiation, a heat treatment is performed at 550° C. for 4 hours in a nitrogen atmosphere.

Subsequently, an aluminum film having a thickness of 2,000 Å to 1 μm is formed by electron beam evaporation, and then patterned into a gate electrode 106. Scandium (Sc) may be doped into aluminum in advance at 0.15 to 0.2 wt %. The substrate is then immersed in an ethylene glycol solution (pH approximately 7) containing tartaric acid of 0.1 to 3%, and subjected to anodic oxidation in which platinum is used as the cathode and the aluminum gate electrode 106 is used as the anode. The anodic oxidation is performed such that in the initial stage the voltage is raised to 220 V with a constant current and this state is kept for 1 hour until the end of the anodic oxidation. In this embodiment, with the constant current, the appropriate voltage raising rate is 2 to 5 V/min. In this manner, an anodic oxide layer 109 having a thickness of 1,500 to 3,500 Å, for instance, 2,000 Å is formed. (FIG. 3(B))

Thereafter, impurities (phosphorus) are doped into the island-like silicon film of each TFT by ion doping (also called plasma doping) in a self-aligned manner with the gate electrode portion used as a mask. Phosphine (PH$_3$) is used as a doping gas, and the dose is set at 1–4×10$^{16}$ cm$^{-2}$.

Figure 3A:
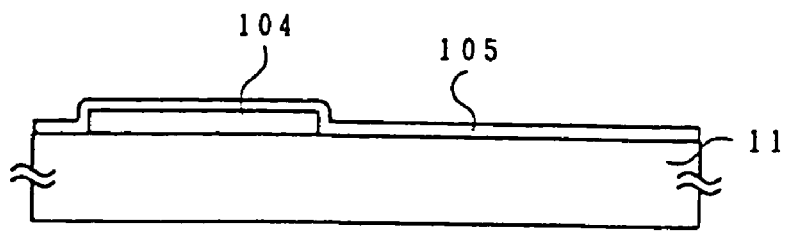
FIGS. 3(A) to 3(E) show a manufacturing process according to a third embodiment of the invention.
Figure 3B:
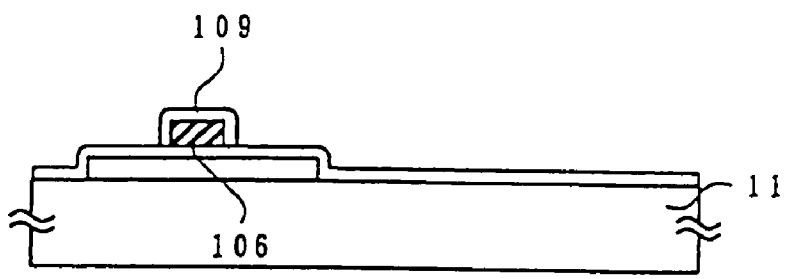
Figure 3C:
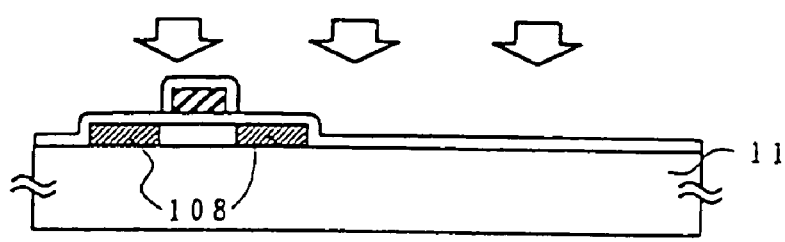
Figure 3D:
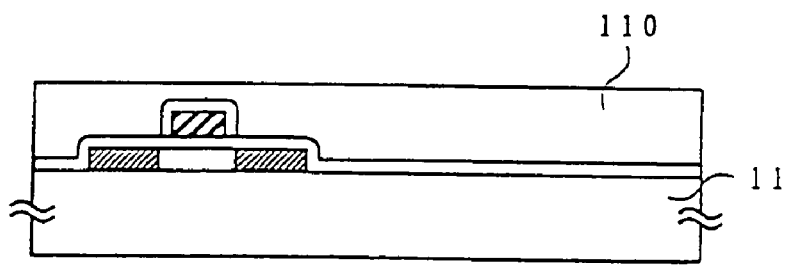

Further, as shown in FIG. 3(C), the portions whose crystallinity has been degraded by the impurity introduction are improved in crystallinity by irradiation with KrF excimer laser light (wavelength: 248 nm; pulse width: 20 nsec). The laser light energy density is set at 150 to 400 mJ/cm$^2$, preferably 200 to 250 mJ/cm$^2$. In this manner, N-type impurity (phosphorus) regions 108 are formed, which has a sheet resistance of 200 to 800 Ω/square.

In the above step, instead of using laser light, strong light equivalent to laser light may be produced by a flash lamp and used to increase the temperature of the sample to 1,000 to 1,200° C. (temperature of a silicon monitor) in a short period. This is RTA (rapid thermal annealing), which is also called a RTP (rapid thermal process).

Subsequently, a 3,000-Å-thick silicon oxide film is formed, as an interlayer insulating film 110, over the entire surface by plasma CVD in which a material of TEOS is used together with oxygen, or low-pressure CVD or normal-pressure CVD in which a material of TEOS is used together with ozone. The substrate temperature is set at 250 to 450° C., for instance, 350° C. After its deposition, the silicon oxide film is polished mechanically to obtain a flat surface. (FIG. 3(D))

Figure 3E:
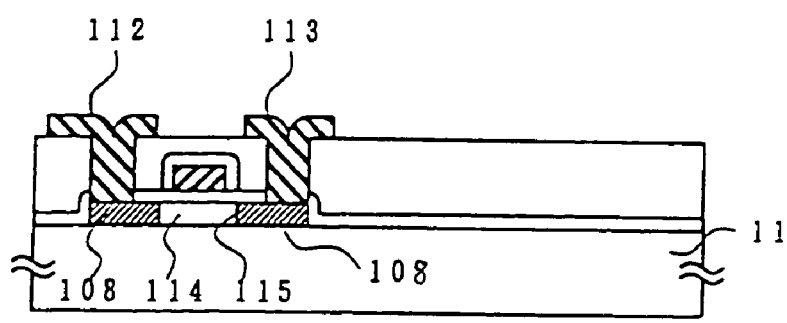
Figure 4A:
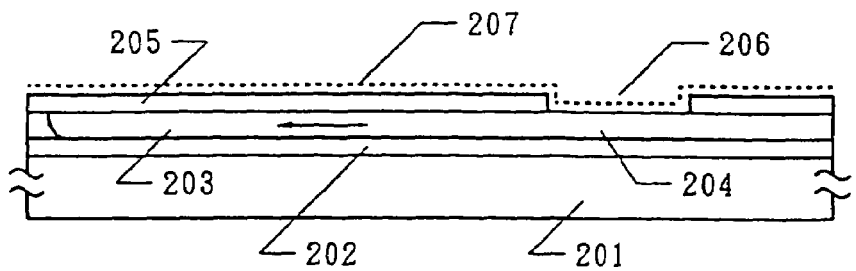
FIGS. 4(A) to 4(F) show a manufacturing process according to a fourth embodiment of the invention.
Figure 4B:
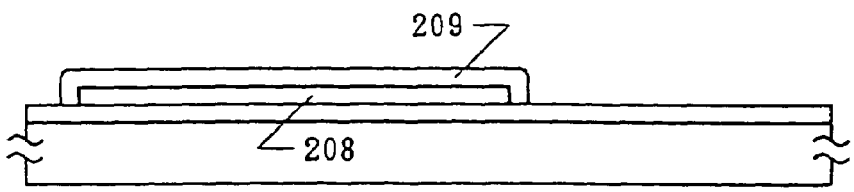
Figure 4C:
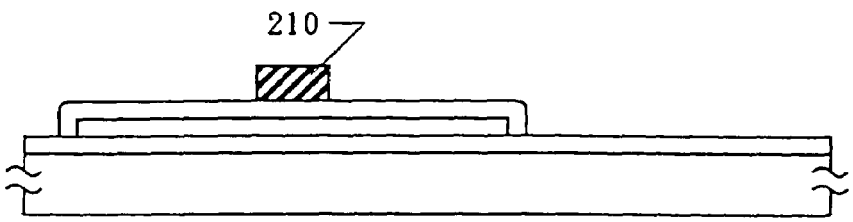
Figure 4D:
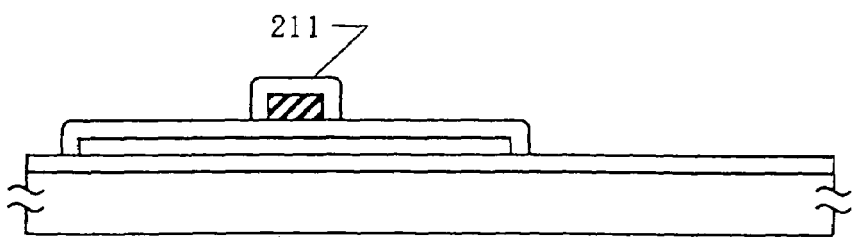
Figure 4E:
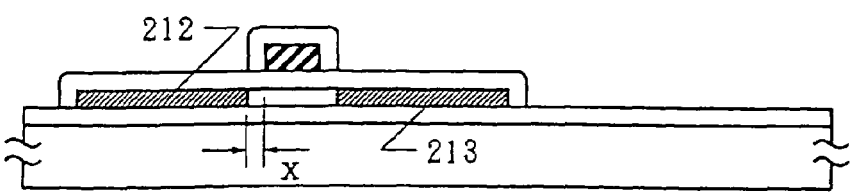
Figure 4F:
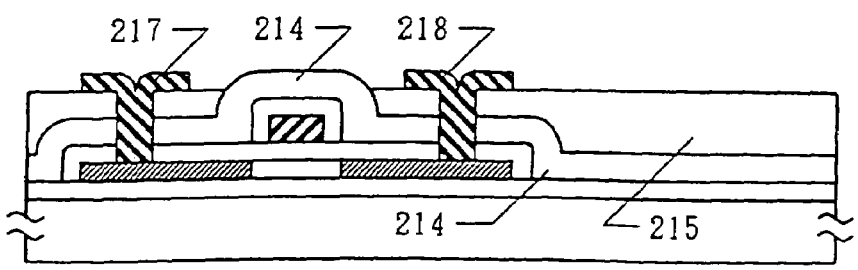
Figure 5A:
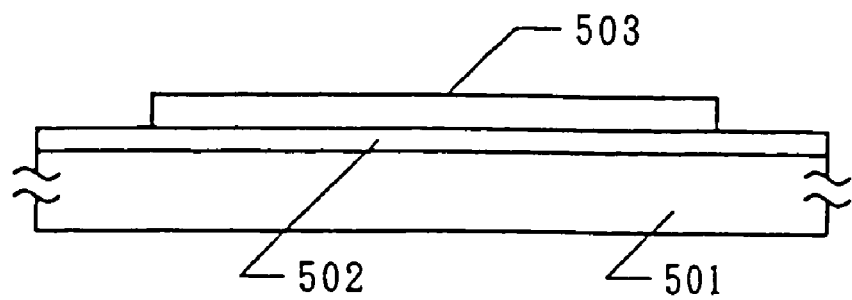
FIGS. 5(A) to 5(D) show a manufacturing process according to a fifth embodiment of the invention.
Figure 5B:
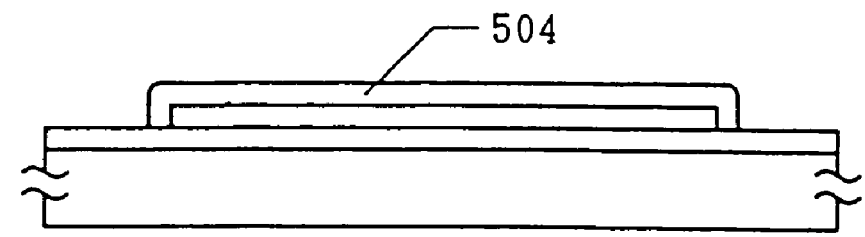
Figure 5C:
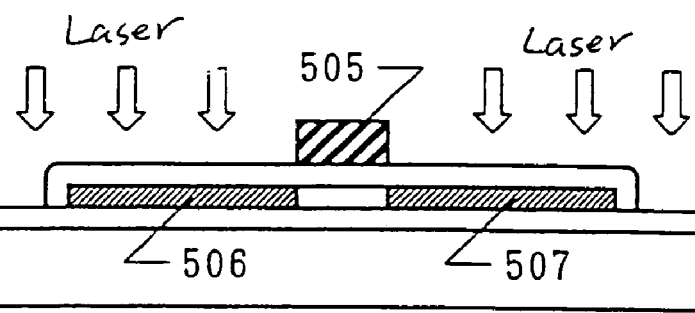
Figure 5D:
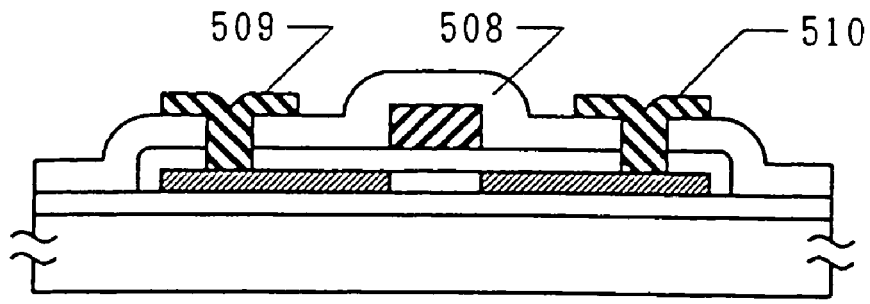

As shown in FIG. 3(E), contact holes are formed for the source and drain of the TFT by etching the interlayer insulating film 110 and wiring lines 112 and 113 of chromium or titanium nitride are formed.

Conventionally, it frequently occurs that a crystalline silicon film into which nickel has been introduced by a plasma treatment is etched in the contact-hole forming step, because of low selectivity between the crystalline silicon film and a silicon oxide film with respect to buffer hydrofluoric acid.

In contrast, according to this embodiment in which nickel is introduced by using the aqueous solution of a low nickel density of 10 ppm, the contact holes can be formed stably with high reproducibility by virtue of high hydrofluoric acid resistance of the crystalline silicon film.

Finally, the sample is annealed at 300 to 400° C. for 1 to 2 hours in a hydrogen atmosphere, to complete hydrogenation of silicon. Thus, the TFT is completed. And an active matrix type liquid crystal display device is formed by a number of TFTs arranged in matrix which are produced at the same time. The TFT has the source and drain regions 108 and 109 and a channel forming region 114. Reference numeral 115 denotes an electrical junction portion of NI.

Where the method of this embodiment is employed, the nickel concentration in the active layer is estimated to be about $3\times10^{18}$ atoms cm$^{-3}$, or in a lower range of $1\times10^{16}$–$3\times10^{18}$ atoms cm$^{-3}$.

Embodiment 4

This embodiment is directed to a case of forming an electronic device by using regions where crystal growth has proceeded horizontally (i.e., parallel with the substrate) from a portion where nickel has been introduced selectively, as in the case of Embodiment 2. By employing such a method, the nickel concentration in the device active layer can further be reduced, which is extremely preferable in terms of the electrical stability and the reliability of the device.

FIGS. 4(A) to 4(F) show a manufacturing process according to this embodiment. First, after a substrate 201 is cleaned, a 2,000 Å thick silicon oxide undercoat film 202 is formed by plasma CVD with TEOS (tetraethoxy silane) and oxygen used as material gases. Then, an intrinsic (I-type) amorphous silicon film 203 having a thickness of 500 to 1,500 Å, for instance, 1,000 Å and a silicon oxide film 205 having a thickness of 500 to 2,000 Å, for instance, 1,000 Å are sequentially deposited by plasma CVD. The silicon oxide film 205 is selectively etched to form a region 206 where amorphous silicon is exposed.

Thereafter, a solution (acetate solution in this embodiment) containing nickel as a catalyst element for accelerating crystallization is applied by the method of Embodiment 2. The nickel density in the acetate solution is 100 ppm. The other detailed procedure and conditions are the same as in Embodiment 2. Alternatively, this step may be performed according to the method of Embodiment 3.

Subsequently, the silicon film 203 is crystallized by scanning it with laser light that has been shaped into a linear beam in a leftward direction on the drawing sheet starting from a region 206. The linear laser light is several tens of centimeters long in the depth direction of the figure and several millimeters to several centimeters wide. This laser light irradiation step is performed in a state that the sample is heated to 550° C.

By performing the above laser light irradiation, crystal growth proceeds parallel with the substrate as indicated by an arrow starting from the region 206 that is in direct contact with nickel. In the region 204, nickel is directly introduced and crystallization is effected. In the region 203, crystallization proceeds horizontally. The horizontally grown crystal region 203 is about several tens of micrometers long. (FIG. 4(A))

After the above crystallization step by the heat treatment, the crystallinity of the silicon film 203 is enhanced by irradiation with infrared light having a wavelength 1.2 μm. This step is equivalent in effect to a high-temperature heat treatment for several minutes.

A halogen lamp is used as an infrared light source. The intensity of the infrared light is adjusted so that the temperature of a monitor single crystal silicon wafer becomes 900 to 1,200° C. More specifically, the temperature of a thermocouple embedded in a silicon wafer is monitored and fed back to the infrared light source. In this embodiment, the temperature is increased at a constant rate of 50 to 200° C./sec and decreased naturally at a rate of 20 to 100° C./sec. Since the infrared light irradiation selectively heats the silicon film, the heating of the glass substrate 201 can be minimized.

Further, a heat treatment is performed at 550° C. for 4 hours in a nitrogen atmosphere to reduce defects in the film. The silicon oxide film 205 is then removed together with the oxide film formed on the surface of the region 206. The silicon film 204 is patterned, i.e., dry-etched into an island-like active layer 208. In the region 206 shown in FIG. 4(A), nickel has been introduced directly and therefore exists at a high concentration. It is also confirmed that nickel exists at a high concentration in the crystal growth end region. That is, the nickel concentration in these regions is higher than in the intermediate region. Therefore, in this embodiment, the active layer 208 is so adapted that the high nickel concentration regions do not overlap with the channel forming region.

Thereafter, the sample is left for one hour in an atmosphere of 10 atm and 500 to 600° C., typically 550° C., including water vapor of 100 volume %, so that the surface of the active layer (silicon film) 208 is oxidized to form a 1,000 Å thick silicon oxide film 209. After the silicon oxide film 209 is formed by thermal oxidation, the substrate is held at 400° C. in an ammonia atmosphere (1 atm, 100%). The silicon oxide film 209 is subjected to nitriding processing by irradiating the substrate in this state for 30 to 180 seconds with infrared light having a peak in a wavelength range of 0.6 to 4 μm, for instance, 0.8 to 1.4 μm. In this step, HCl of 0.1 to 10% may be mixed into the atmosphere. (FIG. 4(B))

Subsequently, an aluminum film (containing scandium at 0.01 to 0.2%) having a thickness of 3,000 to 8,000 Å, for instance, 6,000 Å is deposited by sputtering. The aluminum film is patterned into a gate electrode 210. (FIG. 4(C))

Further, the surface of the aluminum gate electrode 210 is subjected to anodic oxidation to form a 2,000 Å thick oxide layer 211. The anodic oxidation is performed using an ethylene glycol solution containing tartaric acid at 1 to 5%. The thickness of the oxide layer 211 determines the length of offset gate regions in a later ion doping step; that is, this anodic oxidation step can determine the offset. (FIG. 4(D))

Next, impurities for imparting N-type conductivity are added by ion doping (also called plasma doping) in a self-aligned manner to the active layer 208 (constituting the source, drain and channel) with the gate electrode portion (i.e., the gate electrode 210 and the oxide layer 211 surrounding it) used as a mask. Phosphine (PH$_3$) is used as a doping gas, and the acceleration voltage is set at 60 to 90 kV, for instance, 80 kV. The dose is set at $1$–$8\times10^{15}$ cm$^{-2}$, for instance, $4\times10^{15}$ cm$^{-2}$. Thus. N-type impurity regions 212 and 213 can be formed. As is apparent from FIG. 4(E), the gate electrode 210 and the impurity regions 212 and 213 are offset from each other by a distance x. This type of offset state is effective particularly in reducing a leak current (also called an off-current) that flows when the gate electrode 210 is reversely biased (supplied with a negative voltage in the case of an N-channel TFT). The offset is more effective when provided in the TFT for controlling a pixel of an active matrix as in the case of this embodiment, because in such a case the leak current is desired to be low to suppress escape of charge stored in a pixel electrode, to thereby produce superior images.

Subsequently, annealing is effected by laser light irradiation. Although a KrF excimer laser (wavelength: 248 nm; pulse width: 20 nsec) is used in this embodiment, other lasers may also be used. As for the laser light irradiation conditions, the energy density is 200 to 400 mJ/cm$^2$, for instance, 250 mJ/cm$^2$, and 2 to 10 shots, for instance, 2 shots, are applied per one location. The annealing effect may be enhanced by heating the substrate to 200 to 450° C. during the irradiation. (FIG. 4(E))

Thereafter, a 6,000 Å thick silicon oxide film 214 is formed by plasma CVD as an interlayer insulating film. Further, a transparent polyimide film 215 is formed by spin coating to render the surface flat.

After contact holes are opened through the interlayer insulating films 214 and 215, electrodes and wiring lines 217 and 218 of the TFT are formed by using a metallic material such as a multilayered film of titanium nitride and aluminum. Finally, annealing is performed at 350° C. for 30 minutes in a hydrogen atmosphere of 1 atm, to thereby complete a pixel circuit having TFTs of an active matrix. (FIG. 4(F))

Since the TFT manufactured according to this embodiment can have a high mobility, it can also be used in a driver circuit of an active matrix type liquid crystal display device.

Embodiment 5

FIGS. 5(A) to 5(D) are sectional views showing a manufacturing process according to this embodiment. First, a 2,000 Å thick silicon oxide undercoat film 502 is formed on a substrate (Corning 7059) 501 by sputtering. If the substrate is subjected, before or after the formation of the undercoat film, to annealing at a temperature higher than the strain temperature and then gradual cooling to a temperature lower than the strain temperature at a rate of 0.1 to 1.0° C./min, its contraction in subsequent steps that are associated with a temperature increase (including a thermal oxidation step and an ensuing thermal annealing step of the invention) is reduced to facilitate mask alignment. In the case of the Corning 7059 substrate, the following procedure is recommended. The substrate is annealed at 620 to 660° C. for 1 to 4 hours, then gradually cooled at a rate of 0.03 to 1.0° C./min, preferably 0.1 to 0.3° C./min, and taken out when the temperature is reduced to 400 to 500° C.

Thereafter, an intrinsic (I-type) amorphous silicon film 503 having a thickness of 500 to 1,500 Å, for instance, 1,000 Å, is deposited by plasma CVD. Then, nickel as a catalyst element for accelerating crystallization is introduced into the surface of the amorphous silicon film 503 by the method described in Embodiment 1. In a state that the sample is heated to 500° C. in a nitrogen atmosphere (atmospheric pressure), the amorphous silicon film 503 is crystallized by irradiation with KrF excimer laser light. The sample is further subjected to a heat treatment of 550° C. for 4 hours in a nitrogen atmosphere. The silicon film is then patterned into an island-like (a square having sides of 10 to 1,000 μm) silicon film 503, which is to serve as an active layer of the TFT), and the surface is made flat. (FIG. 5(A))

Subsequently, an oxygen atmosphere of 1 atm and 500 to 750° C. (typically 600° C.) which contains water vapor of 70 to 90% is formed by a pyrogenic reaction method with a hydrogen-to-oxygen ratio of 1.5 to 1.9. A silicon oxide film 504 having a thickness of 500 to 1,500 Å, for instance, 1,000 Å, is formed by oxidizing the surface of the silicon film 503 by leaving the sample in such an atmosphere for 3 to 5 hours. It should be noted that the above oxidation reduces the thickness of the surface portion of the silicon film 503 by more than 50 Å, to prevent contamination in the outermost portion of the silicon film 503 from reaching the silicon-silicon oxide boundary. That is, the silicon-silicon oxide boundary can be made clean. A silicon oxide film is two times thicker than a portion to be oxidized of a silicon film. Therefore, where a 1,000-Å-thick silicon oxide is produced by oxidizing a 1,000-Å-thick silicon film, the remaining portion of the silicon film will have a thickness 500 Å.

In general, characteristics such as mobility and off-current can be more improved as the thicknesses of the silicon oxide film (gate insulating film) and the active layer are made thinner. On the other hand, the amorphous silicon film can be crystallized more easily as its initial thickness is made larger. Thus, conventionally, there exists a discrepancy in connection with the active layer thickness between the two objects of obtaining better characteristics and providing an easier process. The present invention has first solved such a discrepancy. That is, according to the present invention, a thick amorphous silicon film is formed before the crystallization, to obtain a superior crystalline silicon film. The silicon film is thereafter thinned by oxidation to improve the characteristics as a TFT. The invention has an additional advantage of a reduced number of recombination centers in the active layer, because amorphous portions and crystal grain boundaries where recombination centers likely occur are oxidized more likely. This contributes to increase of a production yield.

After the silicon oxide film 504 is formed by thermal oxidation, the substrate is annealed at 600° C. for 2 hours in a dinitrogen monoxide atmosphere (1 atm, 100%). (FIG. 5(B))

Subsequently, a polysilicon film (containing phosphorus at 0.01 to 0.2%) having a thickness of 3,000 to 8,000 Å, for instance, 6,000 Å, is formed by low-pressure CVD. The silicon film thus formed is patterned into a gate electrode 505. By using the gate electrode 505 as a mask, impurities (phosphorus in this embodiment) for imparting N-type conductivity to the active layer (to constitute the source, drain and channel) are added by ion doping (also called plasma doping) in a self-aligned manner. Phosphine (PH$_3$) is used as a doping gas, and the acceleration voltage is set at 60 to 90 kV, for instance, 80 kV. The dose is set at 1–8×10$^{15}$ cm$^{-2}$, for instance, 5×10$^{15}$ cm$^{-2}$. Thus, N-type impurity regions 506 and 507 can be formed.

Thereafter, the substrate is subjected to annealing by laser light irradiation. Although a KrF excimer laser (wavelength: 248 nm; pulse width: 20 nsec) is used in this embodiment, other lasers may also be used. As for the laser light irradiation conditions, the energy density is 200 to 400 mJ/cm$^2$, for instance, 250 mJ/cm$^2$, and 2 to 10 shots, for instance, 2 shots, are applied per one location. The annealing effect may be enhanced by heating the substrate to 200 to 450° C. during the irradiation (FIG. 5(C)).

This step may be lamp annealing with infrared light. Infrared light is absorbed by crystallized silicon more easily than amorphous silicon, and can provide effective annealing equivalent to thermal annealing at more than 1,000° C. On the other hand, infrared light is hardly absorbed by a glass substrate. More specifically, although far infrared light is absorbed by a glass substrate, visible light and near infrared light (wavelength range: 0.5 to 4 μm) are hardly absorbed by it. Therefore, the lamp annealing with infrared light never heats a glass substrate to a high temperature, and allows the annealing to be completed in a short period. Thus, it can be said that this method is most suitable for steps where contraction of a glass substrate is problematic.

Figure 6A:
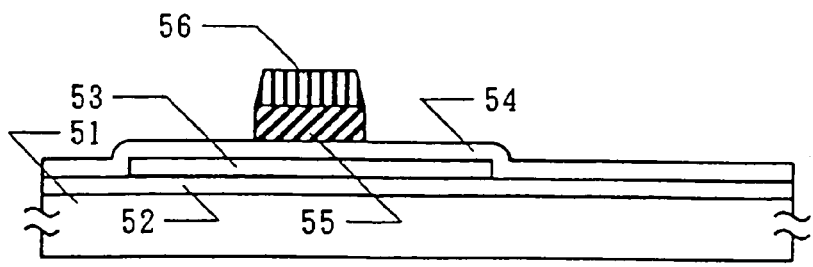
FIGS. 6(A) to 6(F) show a manufacturing process according to a sixth embodiment of the invention.
Figure 6B:
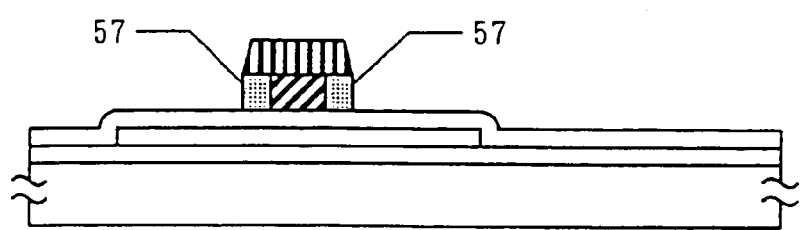
Figure 6C:
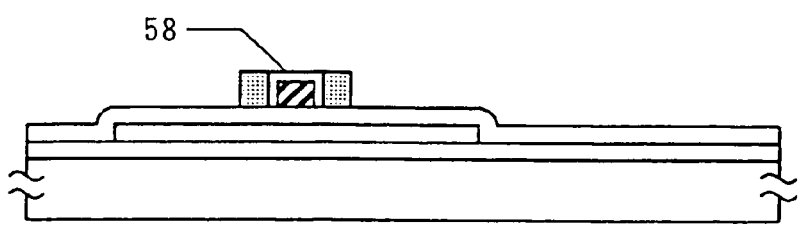
Figure 6D:
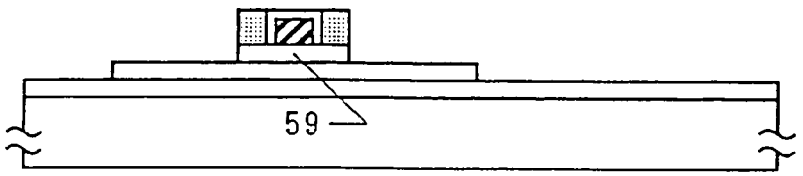
Figure 6E:
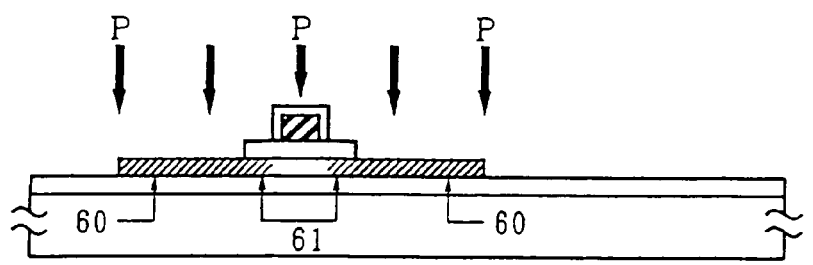
Figure 6F:
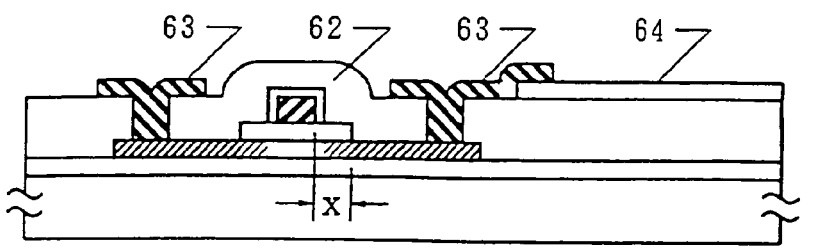

Thereafter, a 6,000 Å thick silicon oxide film 508 is formed by plasma CVD as an interlayer insulating film. Alternatively, the interlayer insulating film may be made of polyimide. After contact holes are opened, electrodes and wiring lines 509 and 510 of the TFT are formed by using a metallic material such as a multilayered film of titanium nitride and aluminum. Finally, annealing is performed at 350° C. for 30 minutes in a hydrogen atmosphere of 1 atm, to complete the TFT. (FIG. 6(D))

TFTs produced by the above method had a mobility of 110 to 150 cm$^2$/Vs and an S-value of 0.2 to 0.5 V/order. P-channel TFTs produced by doping phosphorus into the source and drain in the same manner showed a mobility of 90 to 120 cm$^2$/Vs and an S-value of 0.4 to 0.6 V/order. Thus, the mobility was increased by more than 20% and the S-value was reduced by more than 20% from the case of forming the gate insulating film by known PVD or CVD.

Also in terms of reliability, TFTs produced according to this embodiment showed results equivalent to those produced by performing thermal oxidation at a temperature as high as 1,000° C.

Embodiment 6

FIGS. 6(A) to 6(F) are sectional views showing a manufacturing process according to this embodiment, which is directed to TFTs that are arranged in a pixel area of an active matrix type liquid crystal display device.

First, a 2,000 Å thick silicon oxide undercoat film 52 is formed on a substrate (Corning 7059) 51. Further, an intrinsic (I-type) amorphous silicon film having a thickness of 200 to 1,500 Å, 800 Å in this embodiment, is formed thereon by plasma CVD. Nickel as a catalyst element is introduced by the method of Embodiment 1, and the crystallinity of a resulting crystalline silicon film is enhanced by irradiating it with KrF excimer laser light in a state that it is heated to 550° C. Further, the substrate is subjected to a heat treatment of 550° C. and 4 hours in a nitrogen atmosphere.

In the crystalline silicon film thus produced, there is no clear crystal grain boundary at any particular location. Therefore, the active layer of a TFT can be formed at any location on its surface. That is, since the entire film is uniformly crystallized, properties of a crystalline silicon film that constitutes active layers of all the TFTs can be made uniform even where they are formed in matrix. Thus, there can be obtained a number of TFTs having a small variation in characteristics.

The crystalline silicon film is patterned into an island-like region 53, and a 1,000 Å thick silicon oxide film 54 is formed so as to cover the island-like silicon region 53. Although the following description will be directed to the case of forming one TFT with reference to FIGS. 6(A) to 6(F), actually a necessary number of TFT are formed in matrix at the same time.

Subsequently, an aluminum film (containing scandium at 0.1 to 0.3 wt %) having a thickness of 3,000 to 8,000 Å, for instance, 6,000 Å, is deposited by sputtering, and a thin anodic oxide layer of 100 to 400 Å in thickness is formed on the aluminum film. A photoresist of about 1 μm in thickness is formed on the thus-processed aluminum film by spin coating. And a gate electrode 55 is formed by a known photolithography method. A photoresist mask 56 is left on top of the gate electrode 55. (FIG. 6(A))

Thereafter, the substrate is immersed in an aqueous solution of 10% oxalic acid and anodic oxidation is effected at a constant voltage of 5 to 50 V, for instance, 8 V, for 10 to 500 minutes, for instance 200 minutes, so that a porous anodic oxide layers 57 of about 5,000 Å in thickness are formed on side faces of the gate electrode 55. Since the top surface of the gate electrode 55 is covered with the mask material 56, almost no anodic oxidation occurs there. (FIG. 6(B))

After the mask material 56 is removed to expose the top surface of the gate electrode 55, the substrate is immersed in an ethylene glycol solution (pH-adjusted by use of ammonia) of 3% tartaric acid and anodic oxidation is effected such that the voltage is increased to 100 V at a rate of 1 to 5 V/min, for instance, 4 V/min, with current conduction. In this case, not only the top surface of the gate electrode 55 but also its side faces are subjected to anodic oxidation, so that a dense, non-porous anodic oxidation layer 58 of 1,000 Å in thickness is formed on those surfaces. The anodic oxide layer 58 has a breakdown voltage of more than 50 V. (FIG. 6(C))

Then, the silicon oxide film 54 is etched by dry etching. In this etching step, only the silicon oxide film 54 is etched. i.e., the anodic oxide layers 57 and 58 are not etched. Part of the silicon oxide film 54 under the anodic oxide layers 57 and 58 is not etched and left as a gate insulating film 59. (FIG. 6(D))

Subsequently, the porous anodic oxide layer 57 is etched with a mixed acid of phosphoric acid, acetic acid and nitric acid, to expose the non-porous anodic oxide layers 58. And impurities (phosphorus) are introduced into the silicon region 53 by plasma doping with the gate electrode 55 and the side non-porous anodic oxide layers 58 used as a mask. Phosphine (PH$_3$) is used as a doping gas, and the acceleration voltage is set at 5 to 30 kV, for instance, 10 kV. The dose is set at $1 \times 10^{14}$ to $8 \times 10^{15}$ cm$^{-2}$, for instance, $2 \times 10^{15}$ cm$^{-2}$.

In this doping step, phosphorus is introduced at a high concentration in regions 60 that are not covered with the gate insulating film 59. On the other hand, in a region 61 that is covered with the gate insulating film 59, the doping amount of phosphorus is small because the gate insulating film 59 obstructs its doping. In this embodiment, impurities introduced into the region 61 amount to only 0.1 to 5% of those into the regions 60. Thus, the N-type high-concentration impurity regions 60 and the N-type low-concentration impurity region 61 are formed. (FIG. 6(E))

Thereafter, doped impurities are activated by laser annealing in which laser light is applied from above. A 6,000-Å-thick silicon oxide film 62 is then formed by plasma CVD as an interlayer insulating film. An ITO electrode 64 to become a pixel electrode is then formed. After contact holes are opened, electrodes and wiring lines 63 for the source and drain regions of the TFT are formed by using a metallic material such as a multilayered film of titanium nitride and aluminum. Finally, annealing is performed at 350° C. for 30 minutes in a hydrogen atmosphere of 1 atm. In this manner, the TFT is completed. (FIG. 6(F))

This embodiment can produce the same structure as the lightly doped drain (LDD) structure. It is known that the LDD structure is effective in suppressing degradations due to hot carriers. The TFT produced according to this embodiment has the same advantage. However, the present embodiment can produce the LDD structure with a single doping step, which is not the case in the known process of producing the LDD structure. In addition, this embodiment has a feature that the high-impurity-concentration regions 60 are defined by utilizing the gate insulating film 59 that has been defined by the porous anodic oxide layers 57. That is, ultimately, the impurity regions are indirectly defined by the porous anodic oxide layers 57. As is apparent from this embodiment, the width x of the LDD region is substantially determined by the width of the porous anodic oxide layer 57.

A higher degree of integration can be realized by using the manufacturing method of this embodiment. In such a case, it is more favorable that the width x of the offset region or the LDD region be changed in accordance with the characteristics required for the TFT. In particular, by virtue of a reduced off-current, the method of this embodiment is most suitable for a TFT that is intended to hold charge in a pixel electrode.

Embodiment 7

Figure 7:
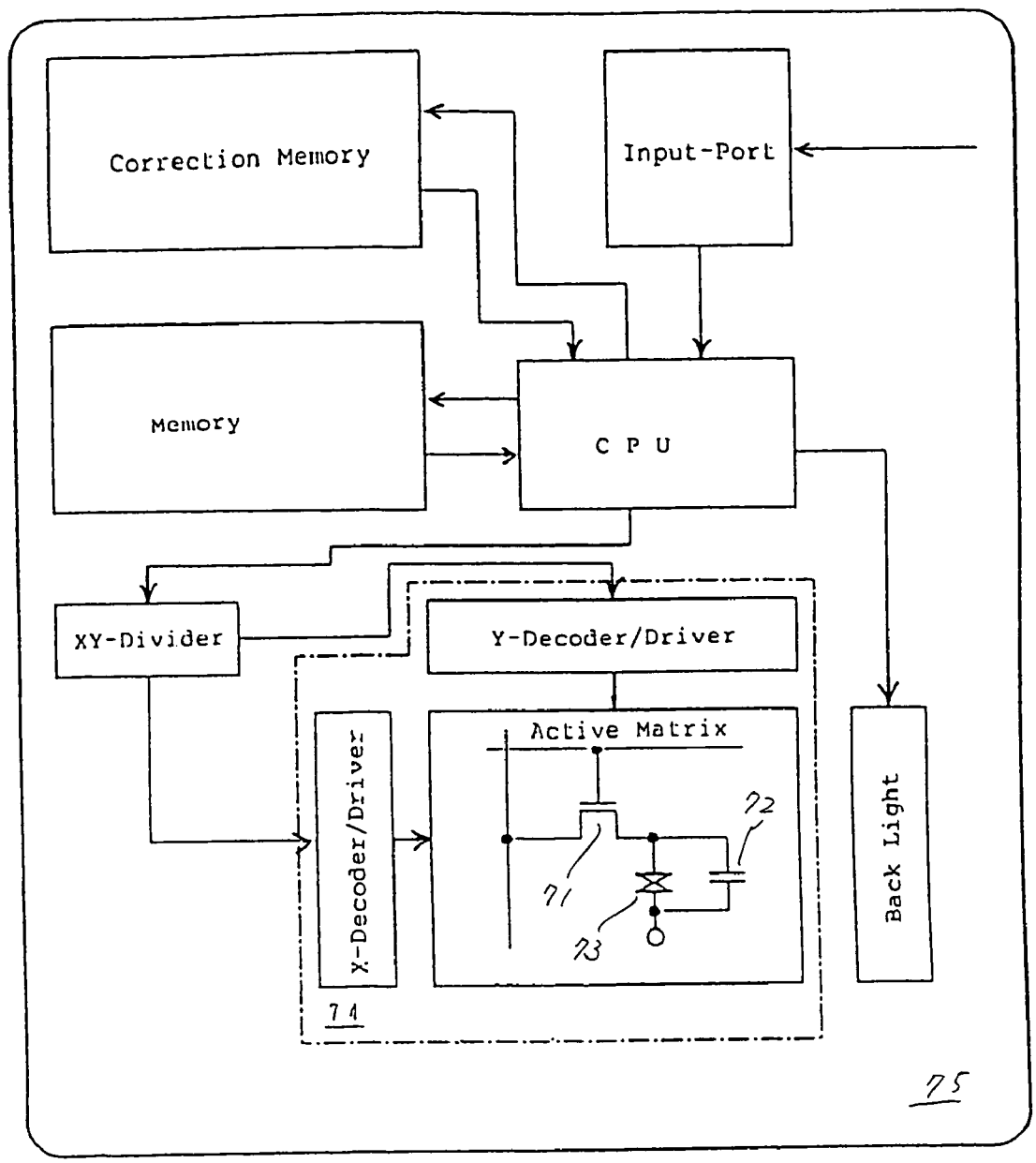
FIG. 7 shows a configuration of Embodiment 7.

FIG. 7 is a block figure of an electro-optical system using an integrated circuit in which a display, central processing unit (CPU), memory, etc. are provided on a single glass substrate. An input port reads an externally input signal and converts it to an image signal. A correction memory corrects an input signal etc. in accordance with the characteristics of an active matrix panel, and is therefore dedicated to the panel. In particular, the correction memory is a fixed memory that has information specific to the respective pixels to allow individual corrections for those pixels. More specifically, where an electro-optical device has a point-defect pixel, signals corrected for that pixel are supplied to pixels around that pixel, to thereby compensate for the point defect, i.e., make it unrecognizable. Where a certain pixel is darker than pixels around it, a larger signal is supplied to that pixel to make the brightness of it be the same level as that of the adjacent pixels.

The central processing unit (CPU) and the memory are of the same kinds as in an ordinary computer. In particular, the memory includes, as a RAM, an image memory corresponding to the respective pixels. Also, the intensity of back light which irradiates from the back side of the substrate can be changed in accordance with image information.

To obtain offset regions or LDD regions suitable for the respective circuits, 3 to 10 groups of wiring lines may be formed to enable the anodic oxidation conditions to be changed for the respective circuits. In a typical case, in the active matrix circuit, the channel length is 10 μm and the width of the LDD region is 0.4 to 1 μm, for instance, 0.6 μm. In an N-channel TFT of a driver, the channel length is 8 μm, the channel width is 200 μm, and the width of the LDD region is 0.2 to 0.3 μm, for instance, 0.25 μm. In a P-channel TFT of the driver, the channel length is 5 μm, the channel width is 500 μm, and the width of the LDD region is 0 to 0.2 μm, for instance, 0.1 μm. In an N-channel TFT of a decoder, the channel length is 8 μm, the channel width is 10 μm, and the width of the LDD region is 0.3 to 0.4 μm, for instance, 0.35 μm. In a P-channel TFT of the decoder, the channel length is 5 μm, the channel width is 10 μm, and the width of the LDD region is 0 to 0.2 μm, for instance, 0.1 μm. Further, in NTFTs and PTFTs of the CPU, input port, correction memory, and memory shown in FIG. 7, the width of the LDD region may be optimized in the same manner as in those of the high-frequency operation, low-power-consumption decoder. In this manner, the electro-optical device 74 can be formed on a single substrate having an insulative surface.

The present invention is characterized in that 2 to 4 or more widths of the high-resistivity region are used for the respective purposes. Further, this region need not always be made of the same material nor have the same conductivity type as the channel forming region. That is, to eliminate degradations due to hot carriers and a tradeoff among the reliability, frequency characteristic, and off-current performance, it is effective to form the high-resistivity region by adding a very small amount of N-type impurities in an NTFT, by adding a very small amount of P-type impurities in a PTFT, or by selectively adding carbon, oxygen, nitrogen, or the like.

It is desirable to use the TFTs described in connection with FIGS. 3(A) to 3(E), 4(A) to 4(F) and 5(A) to 5(D) as TFTs in the driver circuit for driving TFTs for the pixel electrodes.

Embodiment 8

This embodiment is characterized in that a TFT is formed by a manufacturing process summarized below.

(1) The crystallinity of a crystallized silicon film is accelerated by laser light irradiation.

(2) Source and drain regions are formed by forming a gate electrode, and introducing impurity ions with the gate electrode used as a mask.

(3) A heat treatment is performed to re-crystallize the source and drain regions and activate the introduced impurities.

As described above, this embodiment is characterized by the laser light irradiation and the heat treatment. The laser light irradiation is to accelerate crystallization of an amorphous silicon film, and the subsequent heat treatment is to re-crystallize the source and drain regions, activate impurities introduced into those portions, and eliminate defects in the channel forming region.

A description will be made of a TFT manufacturing process shown in FIGS. 9(A) to 9(D). First, a 2,000 Å thick undercoat silicon oxide film 902 is formed on a glass substrate 901 by sputtering, and a 1,000 Å thick amorphous silicon film is formed thereon by plasma CVD or low-pressure thermal CVD. Nickel is then introduced into the surface of the amorphous silicon film by using nickel acetate.

Thereafter, in a state that the sample is heated to 500° C., the crystallinity of a crystalline silicon film 903 is accelerated by irradiating it with XeCl excimer laser light (wavelength: 308 nm) or XeF excimer laser light at an energy density 300 mJ/cm$^2$. (FIG. 9(A))

Then, the crystalline silicon film 903 is patterned to form an active layer of the TFT. After a 1,000 Å thick silicon oxide film to become a gate insulating film 904 is formed by plasma CVD, a 5,000 Å thick film mainly made of aluminum is formed and then patterned into a gate electrode 905. A 2,000 Å thick oxide layer 906 is formed around the gate electrode 905 by performing anodic oxidation in an electrolyte with the gate electrode 905 used as the anode.

Thereafter, a source region 907, a drain region 911, a channel forming region 909, and offset gate regions 908 and 910 are formed in a self-aligned manner by introducing impurity ions with the gate electrode 905 and the oxide region 906 around it used as a mask. To obtain an N-channel TFT, phosphorus ions are used as impurity ions. In this step, the source region 907 and the drain region 911 are rendered amorphous by the impact of ions. (FIG. 9(B))

Figure 9:
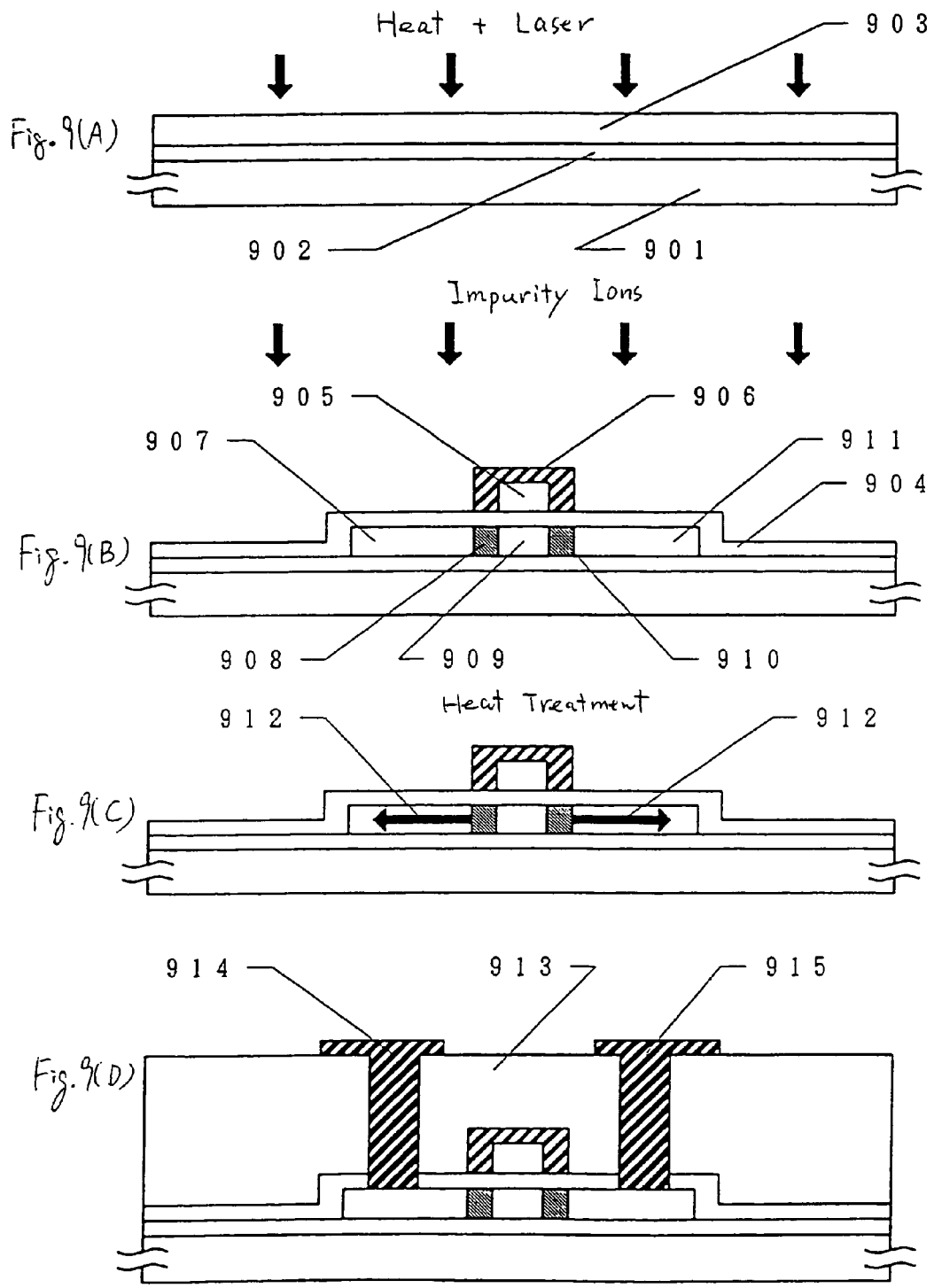
FIGS. 9(A) to 9(D) show a manufacturing process according to Embodiment 8.

In a step shown in FIG. 9(C), the source region 907 and the drain region 911 are re-crystallized and the introduced phosphorus ions are activated by performing a heat treatment at 500° C. for 2 hours. In this step, crystal growth indicated by arrows 912 proceeds from the boundary between the crystalline offset gate region 908 and the amorphous source region 907 and the boundary between the offset gate region 910 and the amorphous drain region 911. That is, the crystal growth proceeds with the gate offset regions 908 and 910 serving as nuclei. The crystal growth proceeds easily at 500° C. or less by virtue of action of phosphorus ions that have been introduced into the source region 907 and the drain region 911. Since continuous crystal structures can be obtained from the offset regions 908 and 910, defect concentration due to lattice mismatching can be prevented.

The heat treatment in the step of FIG. 9(C) may be performed at 300° C. or more. In this embodiment in which the gate electrode 905 is made of aluminum and the heat resistance problem of the glass substrate 901 should be taken into consideration, the heat treatment may be performed in a temperature range of 300 to 600° C.

It is effective to perform annealing by irradiation with laser light or strong light before or after the heat treatment of FIG. 9(C).

Subsequently, a 6,000 Å thick interlayer insulating film is formed by plasma CVD, and a source electrode 914 and a drain electrode 915 are formed. Hydrogenation is then performed by performing a heat treatment in a hydrogen atmosphere of 350° C., complete the TFT shown in FIG. 9(D).

This embodiment is directed to the case of forming the offset gate regions 908 and 910. Where no offset gate regions are formed, crystallization proceeds from the crystalline channel forming region to the source and drain regions in the heat treatment of FIG. 9(C).

Embodiment 9

Figure 10:
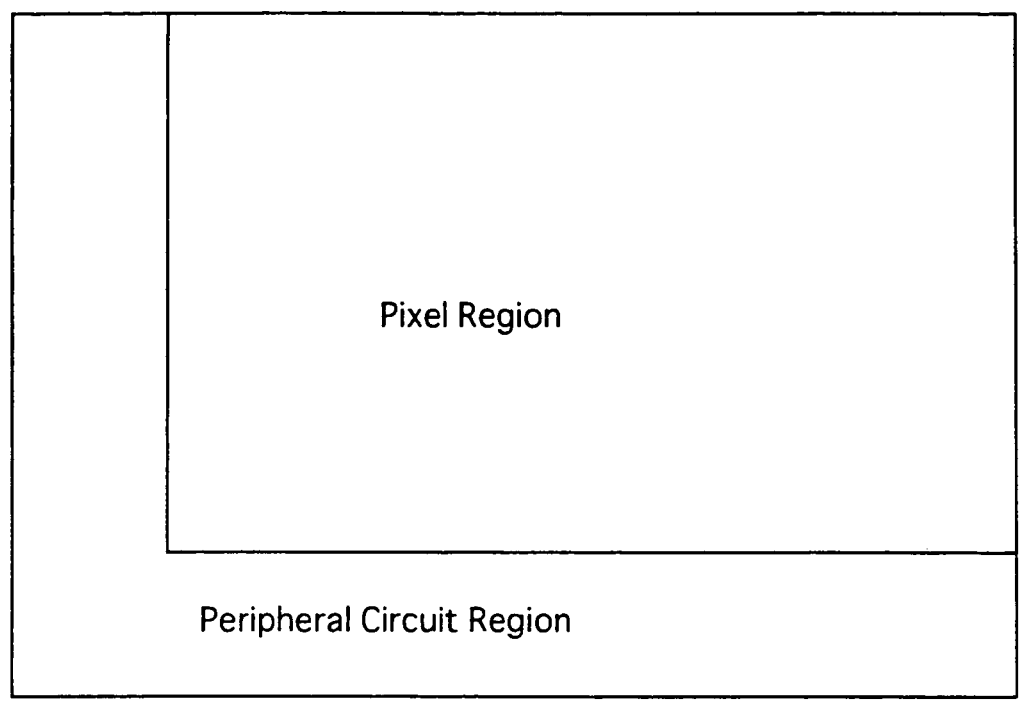
FIG. 10 shows a configuration of an active matrix type liquid crystal device according to Embodiment 9.

This embodiment relates to a configuration of an active matrix type liquid crystal display device. As shown in FIG. 10, an active matrix type liquid crystal display device of this embodiment has a pixel area of a matrix-like arrangement and a peripheral circuit area for driving the pixel area.

TFTs as switching elements are provided for the respective matrix-arranged pixels in the pixel area. The peripheral circuits are also constituted of TFTs.

This embodiment is characterized in that the TFTs constituting the pixel area are formed by not using a metal element and the TFTs constituting the peripheral circuits are formed by using a metal element.

In general, TFTs constituting a pixel area are not required to have a high mobility, but are required to have sufficient stability of characteristics and low off-current. On the other hand, TFTs constituting peripheral circuits are required to allow a large current to flow and have a high mobility.

In view of the above, in this embodiment, the TFTs constituting the peripheral circuits use a crystalline silicon film that has been formed by using nickel and therefore can provide a high mobility. On the other hand, the TFTs constituting the pixel area use a crystalline silicon film that has been formed by laser annealing and therefore cannot provide a high mobility but can provide a low off-current.

To realize the above configuration, nickel element may be selectively introduced into only in silicon films that constitute the peripheral circuit area. Alternatively, the manufacturing process of FIGS. 4(A) to 4(F) may be employed in manufacturing the TFTs that constitute the peripheral circuit area.

As described above, a crystalline silicon film can be obtained by introducing a catalyst element and then performing irradiation with laser light or strong light. The number of defects in the silicon film can be reduced by further performing a heat treatment. By manufacturing a semiconductor device by using the crystalline silicon film that is produced in this manner, the productivity can be increased and the device can be given superior characteristics.

In particular, by using an interstitial catalyst element as typified by Ni, the following advantages can be obtained:

(1) There can be obtained a crystalline silicon film having uniform crystallinity, i.e., not having crystal grain boundaries in particular regions. By using this crystalline silicon film, a large number of TFTs having uniform characteristics which can be used in for instance, an active matrix type liquid crystal display device can be formed on a single plane.

(2) There can be obtained a crystalline silicon film that has been produced by controlling the crystal growth direction, so that a TFT having necessary characteristics can be formed.

What is claimed is:

1. A method of fabricating a semiconductor device comprising:
    forming a semiconductor film over a substrate having an insulating surface;
    selectively introducing a material comprising metal for promoting crystallization of the semiconductor film;
    irradiating the semiconductor film with a laser light to crystallize;
    after irradiating, annealing the irradiated semiconductor film with a light; and
    after annealing, patterning the semiconductor film to form at least one semiconductor island.

2. A method according to claim 1 wherein said laser light is selected from the group consisting of KrF, XeCl, XeF, and ArF.

3. A method according to claim 1 wherein said light is an infrared light.

4. A method according to claim 1 further comprising a step of forming at least channel, source, and drain regions in the semiconductor island by introducing impurities therein.

5. A method according to claim 1, wherein said semiconductor device comprises a central processing unit (CPU) on the substrate.

6. A method of fabricating a semiconductor device comprising:
    forming an insulating film on a substrate;
    forming a semiconductor film on the insulating film;
    selectively introducing a material comprising metal for promoting crystallization of the semiconductor film;
    irradiating the semiconductor film with a laser light to crystallize;
    after irradiating, annealing the irradiated semiconductor film with a light; and
    patterning the semiconductor film to form at least one semiconductor island.

7. A method according to claim 6 wherein said laser light is selected from the group consisting of KrF, XeCl, XeF, and ArF.

8. A method according to claim 6 wherein said light is an infrared light.

9. A method according to claim 6 further comprising a step of forming at least channel, source, and drain regions in the semiconductor island film by introducing impurities therein.

10. A method according to claim 6, wherein said semiconductor device comprises a CPU on the substrate.

11. A method of fabricating a semiconductor device comprising:
    forming a semiconductor film over a substrate having an insulating surface;
    applying a material comprising metal for promoting crystallization to the semiconductor film;
    irradiating the semiconductor film with a laser light to crystallize;

after irradiating, annealing the irradiated semiconductor film with a light; and after annealing, patterning the semiconductor film to form at least one semiconductor island.

12. A method according to claim 11 wherein said laser light is selected from the group consisting of KrF, XeCl, XeF, and ArF.

13. A method according to claim 12 wherein said light is an infrared light.

14. A method according to claim 11 wherein said metal is at least one selected from the group consisting of Fe, Co, Ni, Ru, Rh, Pd, Os, Ir, Pt, Cu, Ag and Au.

15. A method according to claim 11 further comprising a step of forming at least channel, source, and drain regions in the semiconductor island by introducing impurities therein.

16. A method according to claim 11, wherein said semiconductor device is used in a CPU on the substrate.

17. A method of fabricating a semiconductor device comprising:

forming a semiconductor film over a substrate having an insulating surface;

selectively introducing a material comprising metal for promoting crystallization of the semiconductor film;

crystallizing the semiconductor film by a laser irradiation with a laser light;

after the laser irradiation, annealing the irradiated semiconductor film with a light so as to increase crystallinity of the semiconductor film;

heating the annealed semiconductor film in an atmosphere comprising nitrogen; and after heating, patterning the semiconductor film to form at least one semiconductor island.

18. A method according to claim 17 wherein said laser light is selected from the group consisting of KrF, XeCl, XeF, and ArF.

19. A method according to claim 17 wherein said light is an infrared light.

20. A method according to claim 17 further comprising a step of forming at least channel, source, and drain regions in the semiconductor island by introducing impurities therein.

21. A method according to claim 17, wherein said semiconductor device comprises a CPU on the substrate.

22. A method of fabricating a semiconductor device comprising:

forming a semiconductor film over a substrate having an insulating surface;

introducing a material comprising metal for promoting crystallization to the semiconductor film;

irradiating the semiconductor film with a laser light to crystallize;

after irradiating, annealing the irradiated semiconductor film with a light;

after annealing, patterning the semiconductor film to form at least one semiconductor island; and forming a gate insulating film over the semiconductor island.

23. A method according to claim 22 wherein said laser light is selected from the group consisting of KrF, XeCl, XeF, and ArF.

24. A method according to claim 22 wherein said light is an infrared light.

25. A method according to claim 22 wherein said metal is at least one selected from the group consisting of Fe, Co, Ni, Ru, Rh, Pd, Os, Ir, Pt, Cu, Ag and Au.

26. A method according to claim 22 further comprising a step of heating the annealed semiconductor film in an atmosphere comprising nitrogen.

27. A method according to claim 22 further comprising a step of forming at least channel, source, and drain regions in the semiconductor island by introducing impurities therein.

28. A method according to claim 22, wherein said semiconductor device comprises a CPU on the substrate.

29. A method of fabricating a semiconductor device comprising:

forming a semiconductor film over a substrate having an insulating surface;

selectively introducing a material comprising metal for promoting crystallization of a first portion of the semiconductor film wherein the metal is not introduced to a second portion of the semiconductor film;

irradiating the semiconductor film with a laser light to crystallize;

after irradiating, annealing the irradiated semiconductor film with a light; and after irradiating, patterning the semiconductor film to form at least first and second semiconductor islands, wherein the first semiconductor island includes the first portion of the semiconductor film and the second semiconductor island includes the second portion of the semiconductor film.

30. A method according to claim 29, wherein the laser light is selected from the group consisting of KrF, XeCl, XeF, and ArF.

31. A method according to claim 29, wherein the light is an infrared light.

32. A method according to claim 29, wherein a thin film transistor of a peripheral circuit portion includes the first semiconductor island and a thin film transistor of a pixel portion includes the second semiconductor island.

* * * * *